US012500551B2

(12) United States Patent
Souza et al.

(10) Patent No.: US 12,500,551 B2
(45) Date of Patent: Dec. 16, 2025

(54) TECHNIQUES FOR IMPROVING THE POWER EFFICIENCY OF A PLAYBACK DEVICE

(71) Applicant: Sonos, Inc., Santa Barbara, CA (US)

(72) Inventors: Chadwick James Souza, Providence, RI (US); Aurelio Rafael Ramos, Cambridge, MA (US)

(73) Assignee: Sonos, Inc., Goleta, CA (US)

( * ) Notice: Subject to any disclaimer, the term of this patent is extended or adjusted under 35 U.S.C. 154(b) by 659 days.

(21) Appl. No.: 17/905,790

(22) PCT Filed: Mar. 19, 2021

(86) PCT No.: PCT/US2021/023212
§ 371 (c)(1),
(2) Date: Sep. 7, 2022

(87) PCT Pub. No.: WO2021/194883
PCT Pub. Date: Sep. 30, 2021

(65) Prior Publication Data
US 2023/0111696 A1    Apr. 13, 2023

Related U.S. Application Data

(60) Provisional application No. 63/158,132, filed on Mar. 8, 2021, provisional application No. 62/994,049, filed on Mar. 24, 2020.

(51) Int. Cl.
*H03F 3/04* (2006.01)
*H03F 1/02* (2006.01)
(Continued)

(52) U.S. Cl.
CPC ........... *H03F 1/0222* (2013.01); *H03F 3/183* (2013.01); *H04N 21/4398* (2013.01); *H04N 21/4436* (2013.01); *H03F 1/0244* (2013.01)

(58) Field of Classification Search
CPC ...... H03F 1/0222; H03F 3/183; H03F 1/0227; H03F 1/0244; H03F 1/0211;
(Continued)

(56) References Cited

U.S. PATENT DOCUMENTS 5,440,644 A    8/1995  Farinelli et al.
5,761,320 A    6/1998  Farinelli et al.
(Continued)

FOREIGN PATENT DOCUMENTS

EP    1389853 A1    2/2004
WO    200153994     7/2001
WO    2003093950 A2    11/2003

OTHER PUBLICATIONS

Audio Tron Quick Start Guide, Version 1.0, Mar. 2001, 24 pages.
(Continued)

*Primary Examiner* — Khanh V Nguyen
(74) *Attorney, Agent, or Firm* — Finch & Maloney PLLC

(57) ABSTRACT

A playback device including a processor that executes program instructions such that the playback device is configured to receive first audio data representing audio content, generate and output second audio data based on the first audio data, and at least in part while generating and outputting the second audio data, generate and output a control signal associated with the second audio data to vary a supply voltage for an audio amplifier. The playback device also includes a switch-mode power supply (SMPS) that varies the supply voltage for the audio amplifier based on the control signal. The playback device also includes an amplifier circuitry comprising the audio amplifier powered by the supply voltage from the SMPS. The amplifier circuitry is configured to receive the second audio data and generate an analog audio signal to drive a speaker based on the second audio data.

17 Claims, 19 Drawing Sheets

(51) Int. Cl.
*H03F 3/183* (2006.01)
*H03F 3/20* (2006.01)
*H04N 21/439* (2011.01)
*H04N 21/443* (2011.01)

(58) Field of Classification Search
CPC . H03F 2200/504; H03F 3/04; H04N 21/4398; H04N 21/4436; H04N 21/43615; H04N 21/8106; H03G 3/3042; H03G 3/004
USPC ........................................ 330/127, 129, 297
See application file for complete search history.

(56) References Cited

U.S. PATENT DOCUMENTS

| | | | |
|---|---|---|---|
| 5,923,902 | A | 7/1999 | Inagaki |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,391,791 | B2 | 6/2008 | Balassanian et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,657,910 | B1 | 2/2010 | McAulay et al. |
| 7,853,341 | B2 | 12/2010 | McCarty et al. |
| 7,987,294 | B2 | 7/2011 | Bryce et al. |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,234,395 | B2 | 7/2012 | Millington |
| 8,483,853 | B1 | 7/2013 | Lambourne |
| 8,942,252 | B2 | 1/2015 | Balassanian et al. |
| 9,231,627 | B2 * | 1/2016 | Arno ................... H03F 3/19 |
| 9,590,665 | B2 * | 3/2017 | Lim .................... H03F 3/217 |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty, Jr. |
| 2004/0024478 | A1 | 2/2004 | Hans et al. |
| 2007/0142944 | A1 | 6/2007 | Goldberg et al. |
| 2010/0052781 | A1 * | 3/2010 | Nentwig ............. H03F 1/30 330/149 |
| 2015/0030184 | A1 * | 1/2015 | Yamada ............. H03F 3/183 330/297 |
| 2016/0197588 | A1 * | 7/2016 | Olson ................. H03F 1/0227 381/120 |
| 2018/0248525 | A1 * | 8/2018 | Orr .................... H02M 3/1582 |
| 2018/0337637 | A1 * | 11/2018 | Galal ................. H03F 1/0233 |

OTHER PUBLICATIONS

Audio Tron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
International Searching Authority, International Search Report and Written Opinion mailed on Jul. 16, 2021, issued in connection with International Application No. PCT/US2021/023212, filed on Mar. 19, 2021, 11 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Palm, Inc., "Handbook for the Palm VII Handheld," May 2000, 311 pages.
Presentations at WinHEC 2000, May 2000, 138 pages.
*Sonos, Inc.* v. *DM Holdings* (No. 14-1330-RGA), DI 219, Claim Construction Opinion (Jan. 12, 2017) (24 pages).
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
European Patent Office, European EPC Article 94.3 mailed on Sep. 18, 2024, issued in connection with European Application No. 21726238.5, 8 pages.
International Bureau, International Preliminary Report on Patentability and Written Opinion, mailed on Oct. 6, 2022, issued in connection with International Application No. PCT/US2021/023212, filed on Mar. 19, 2021, 10 pages.

* cited by examiner

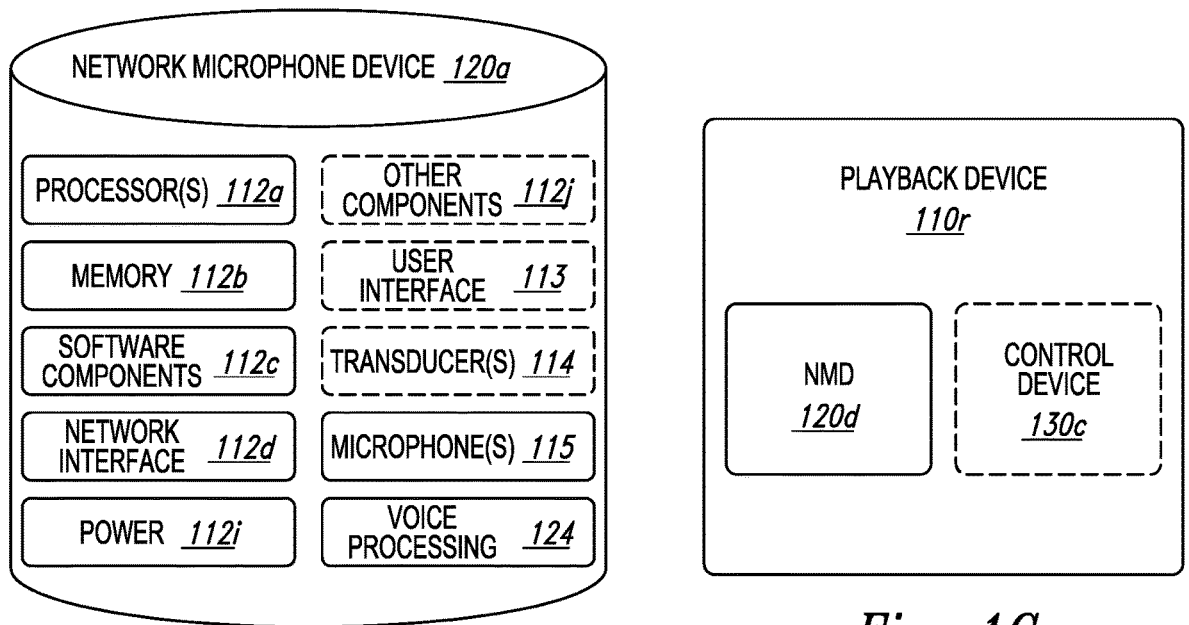
Fig. 1F
Fig. 1G
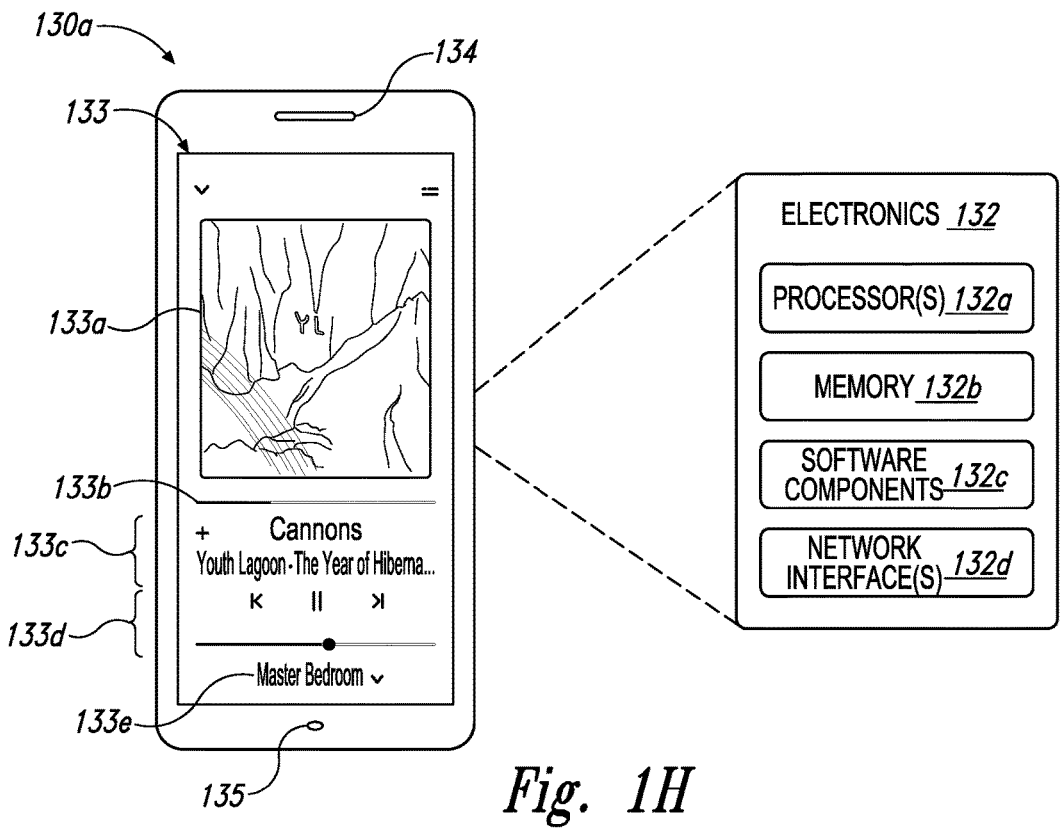
Fig. 1H

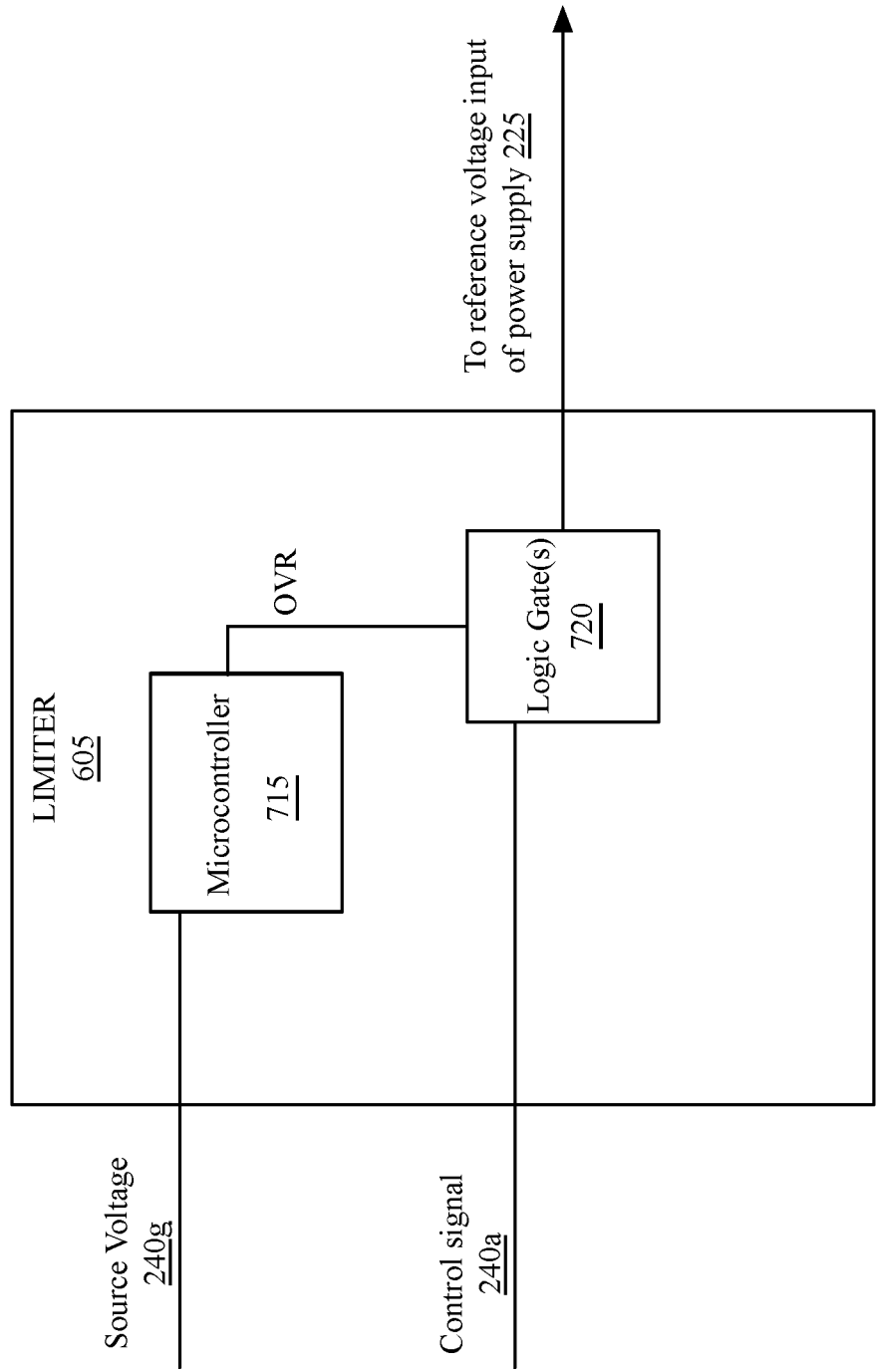

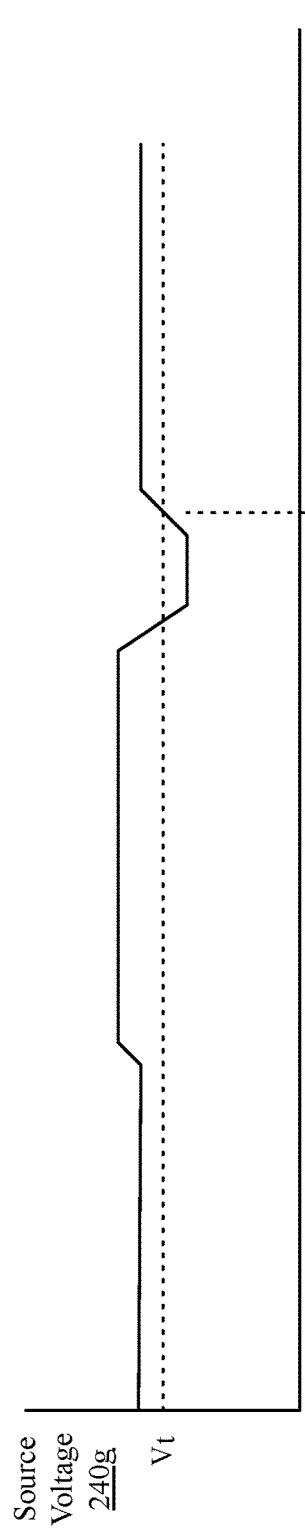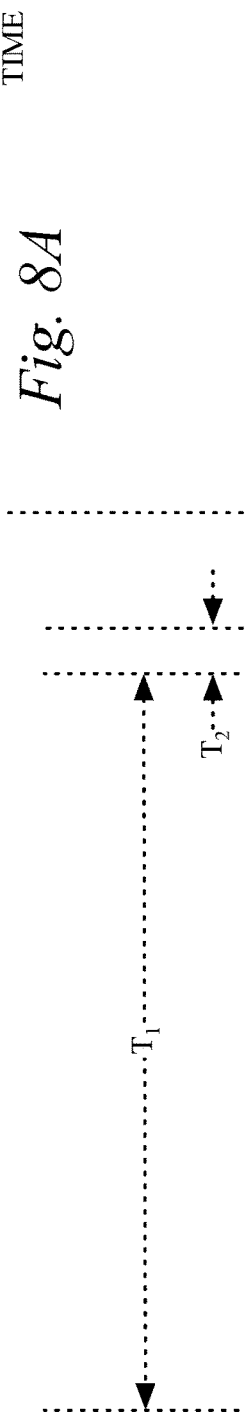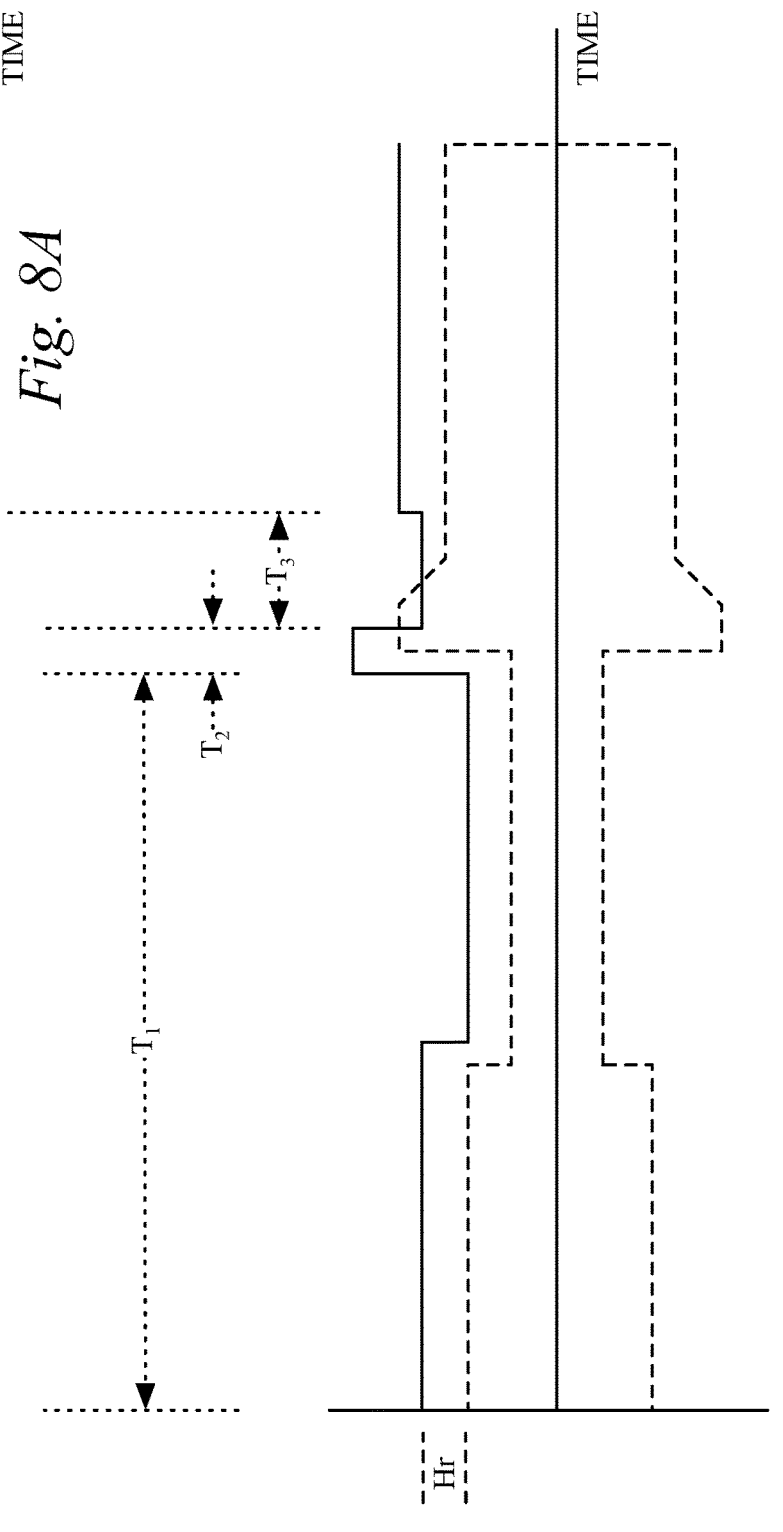

TECHNIQUES FOR IMPROVING THE POWER EFFICIENCY OF A PLAYBACK DEVICE

CROSS-REFERENCE TO RELATED APPLICATIONS

This application is a national stage application under 35 U.S.C. § 371 of PCT Application No. PCT/US2021/023212, titled "Techniques for Improving the Power Efficiency of a Playback Device," filed Mar. 19, 2021, which claims priority to U.S. Provisional Application 62/994,049, titled "Techniques for Improving the Power Efficiency of a Playback Device," filed on Mar. 24, 2020, and U.S. Provisional 63/158,132, titled "Techniques for Improving the Power Efficiency of a Playback Device," filed on Mar. 8, 2021. The disclosures of U.S. Provisional Applications 62/994,049 and 63/158,132 are incorporated herein by reference in their entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until 2002 when SONOS, Inc. began the development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1F is a block diagram of a network microphone device, in accordance with an example.

FIG. 1G is a block diagram of a playback device, in accordance with an example.

FIG. 1H is a partially schematic diagram of a control device, in accordance with an example.

FIG. 7C illustrates a logical diagram of another limiter of the circuitry of FIG. 6, in accordance with an example.

FIG. 8A illustrates a source voltage provided by a power source of the circuitry where the source voltage momentarily drops below a low voltage threshold, in accordance with an example.

FIG. 8B illustrates an amplifier supply voltage and an envelope associated with audio output during the sudden increase, in accordance with an example.

Figure 1A:
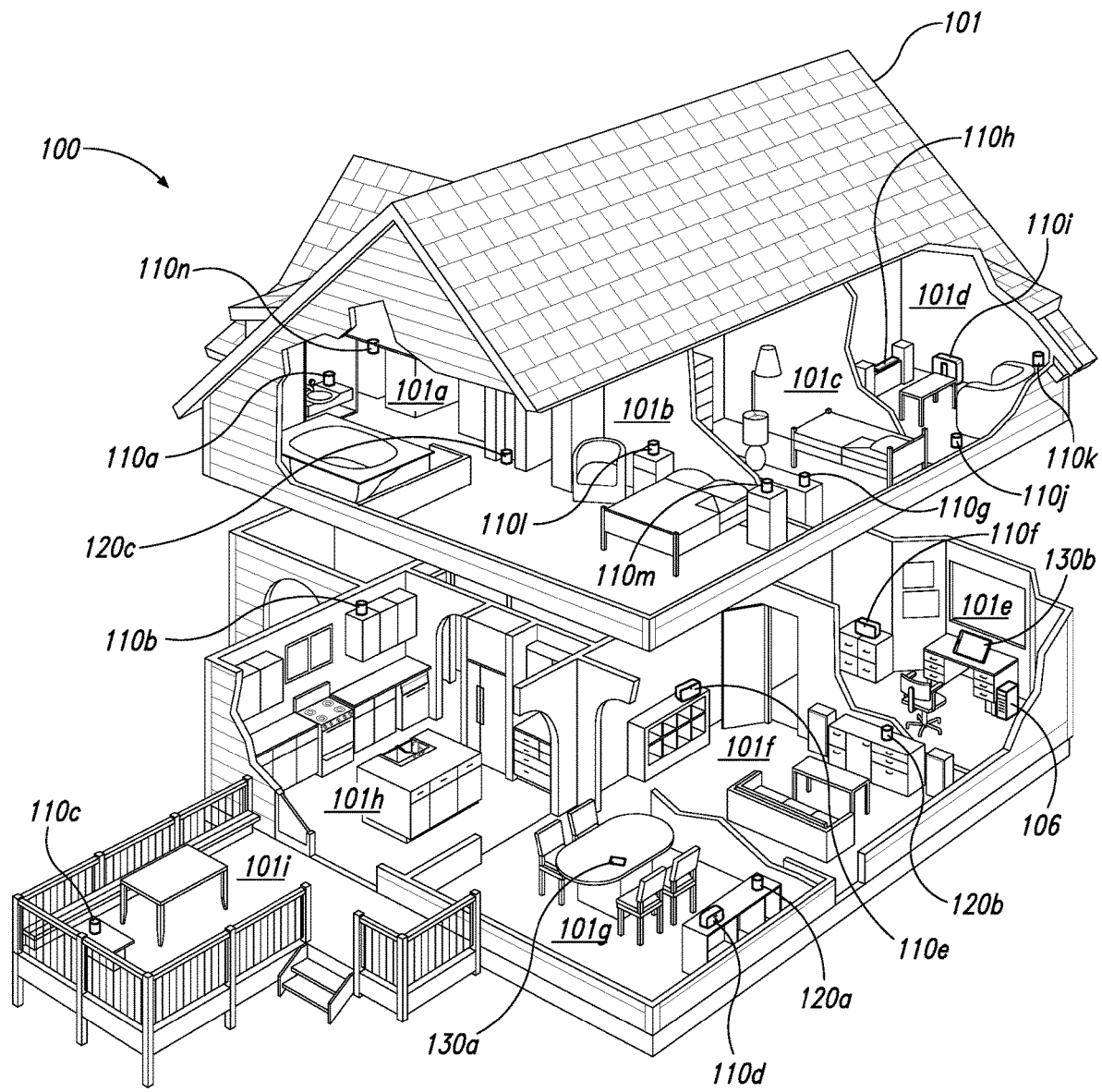
FIG. 1A is a partial cutaway view of an environment having a media playback system, in accordance with an example.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

SONOS, Inc. has been a consistent innovator in the audio space for well over a decade and established a reputation for creating products with outstanding sound quality in form factors that can blend into their environment (e.g., a user's home, a business or other commercial establishment, etc.). In contrast to competitors that integrate low-quality transducers into their products to make passable sound, SONOS, Inc. has taken an uncompromising approach to the design of the transducers and the amplifiers that drive them to deliver a superior sound experience.

As SONOS, Inc. has expanded into new product categories, including battery-powered playback devices, SONOS, Inc. has remained committed to offering a class-leading audio experience for every product. In the context of battery-powered playback devices, providing a class-leading audio experience without compromises for the end-user presents a variety of challenges. Given that the power consumption of an audio amplifier typically increases with the playback volume, one challenge is simultaneously achieving sound volumes that are significantly higher than comparable battery-powered devices while still maintaining a runtime on battery power that is at least as long as such comparable battery-powered devices.

To improve the power efficiency of a playback device (and thus a total runtime of the playback device operating on battery power), some playback devices employ a switching amplifier (e.g., a Class-D amplifier) to drive the transducer. Switching amplifiers generally have significantly higher power efficiencies than linear amplifiers (e.g., Class-A, B, AB, and C amplifiers). A switching amplifier typically includes one or more switches connected to the power supply rails of the switching amplifier that are used to generate a series of pulses with properties (e.g., pulse-width, pulse density, etc.) that vary based on the input signal. The series of pulses may, in turn, be filtered (e.g., using a low-pass filter) to generate an output signal. While switching amplifiers may provide a power savings relative to other types of amplifiers (e.g., linear amplifiers), the power savings from using a switching amplifier alone may be insufficient to provide class-leading audio performance in a battery-powered playback device for a long runtime on battery power.

Aspects of the present disclosure manifest an appreciation that conventional playback device designs use fixed supply voltages for the amplifier. Typically, the fixed supply voltage is set to a level that is sufficiently high to support non-distorted amplification of the worst case (e.g., highest amplitude) input signal that is expected. However, the occurrence of such a worst-case input signal during normal operation is relatively infrequent. As a result, the fixed supply voltage is frequently significantly higher than is otherwise required by the amplifier to amplify the input signal. Moreover, the reduction of the supply voltage for the amplifier to a voltage level that is just above the voltage level required to amplify the input signal without distortion can increase the power efficiency of the playback device.

Given the higher power requirements for audio amplification relative to other domains (e.g., wireless radios), one technical challenge is how to successfully vary the amplifier supply voltage without reducing the power efficiency of other components in the device. For example, one approach would be to use a linear power supply to generate the amplifier supply voltage based on the input signal to the amplifier. The large bandwidth of a linear power supply enables the amplifier supply voltage to be changed rapidly such that the amplifier supply voltage can closely track the minimum voltage required for amplifier operation. While such an approach may work in domains where the power levels are relatively low (e.g., in wireless radios), such a design does not necessarily scale well to higher power levels. Linear power supplies are typically much less power efficient than other types of power supplies with smaller bandwidths (e.g., a switch-mode power supply (SMPS)) at the power levels commonly required for audio amplification. As a result, the gains from varying the supply voltage with a linear power supply may be entirely offset by the lower power efficiency of the linear power supply. In some instances, a playback device that employs a fixed amplifier supply voltage generated by a high efficiency and low bandwidth power supply can actually outperform (e.g., have a lower total power consumption) a design that varies the amplifier supply voltage using a linear power supply.

Accordingly, aspects of the present disclosure relate to techniques that enable the use of a power supply with a high efficiency (e.g., and/or a low bandwidth) to generate the varying supply voltage for an amplifier (e.g., a switching amplifier) without causing distortion (e.g., clipping). Thus, the power efficiency of the amplifier may be improved without the trade-off of using a power supply with a low power efficiency (e.g., and a large bandwidth). In some examples, the control signal for the power supply is generated in a feedforward control loop based on future data that has yet to reach the amplifier. In these examples, particular events in the audio that may require a significant ramp-up in the amplifier supply voltage (e.g., an audio track for an action movie in a scene with explosions) can be anticipated well before that portion of the audio reaches the amplifier. When such an event is detected, the supply voltage can be ramped-up slowly in anticipation of that event to successfully avoid a rapid slew in the amplifier supply voltage. As a result, power supplies with smaller bandwidths (e.g., SMPSs) and high power efficiencies can be employed to generate a varying amplifier supply voltage.

The look-ahead in the audio may be effectuated in any of a variety of ways. In some implementations, the look-ahead may be achieved by performing the calculation for the amplifier supply voltage upstream of the amplifier with a component that has access to the audio. For example, the calculation may be performed by at least one processor (e.g., at least one application processor) in the playback device that executes a computer program (e.g., an application) that handles one or more audio processing tasks (e.g., obtaining the audio from an external source, decoding the audio, etc.). Such a processor already has access to audio content that has yet to be transmitted to the amplifier for playback. Thus, the processor can use that direct access to future the audio content to estimate the amount of voltage required by the amplifier to amplify an audio signal having a particular amplitude without appreciable distortion and output a control signal to the power supply (e.g., SMPS) to control the supply voltage for the amplifier.

One example of a playback device that employs the power saving techniques described herein includes a communication interface (e.g., a wireless communication interface such as a BLUETOOTH communication interface and/or a wireless local area network (WLAN) interface) configured to facilitate communications via at least one network (e.g., a WLAN and/or a BLUETOOTH network). The playback device includes processor circuitry comprising at least one processor coupled to the communication interface. The playback device further includes at least one non-transitory computer-readable medium coupled to the at least one processor. The computer-readable medium stores program instructions that are executable by the at least one processor such that the processor circuitry is configured to receive, via the communication interface, first audio data representing audio content (e.g., from a computing system). The program instructions can further cause the processor circuitry to generate and output second audio data based on the first audio data, and at least in part while generating and outputting the second audio data, generate and output a control signal (e.g., a feedforward control signal) associated with the second audio data to vary a supply voltage for an amplifier (e.g., a Class-D amplifier). The playback device also includes a power supply (e.g., an SMPS) coupled to the processor circuitry. The power supply is configured to receive the control signal from the processor circuitry and to vary the supply voltage for the amplifier based on the control signal. Amplifier circuitry of the playback device is coupled to the processor circuitry and the power supply. The amplifier circuitry comprises the amplifier that is powered by the supply voltage from the power supply. The amplifier circuitry is configured to receive the second audio data from the processor circuitry and to generate an analog audio signal to drive a speaker based on the second audio data (e.g., while the supply voltage from the power supply is being varied).

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110a is first introduced and discussed with reference to FIG. 1A. Many of the details, dimensions, angles and other features shown in the Figures are merely illustrative of particular embodiments of the disclosed technology. Accordingly, other embodiments can have other details, dimensions, angles, and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110a-n), one or more network microphone devices ("NMDs"), 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100a) in synchrony with a second playback device (e.g., the playback device 100b). Interactions between the playback devices 110, NMDs 120, and/or control devices 130 of the media playback system 100 configured in accordance with the various embodiments of the disclosure are described in greater detail below with respect to FIGS. 1B-1M.

In the illustrated embodiment of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments. In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the balcony 101i. In some aspects, a single playback zone may include multiple rooms or spaces. In certain aspects, a single room or space may include multiple playback zones.

In the illustrated embodiment of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B and 1M.

In some aspects, one or more of the playback zones in the environment 101 may each be playing different audio content. For instance, a user may be grilling on the patio 101i and listening to hip hop music being played by the playback device 110c while another user is preparing food in the kitchen 101h and listening to classical music played by the playback device 110b. In another example, a playback zone may play the same audio content in synchrony with another playback zone. For instance, the user may be in the office 101e listening to the playback device 110f playing back the same hip hop music being played back by playback device 110c on the patio 101i. In some aspects, the playback devices 110c and 110f play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
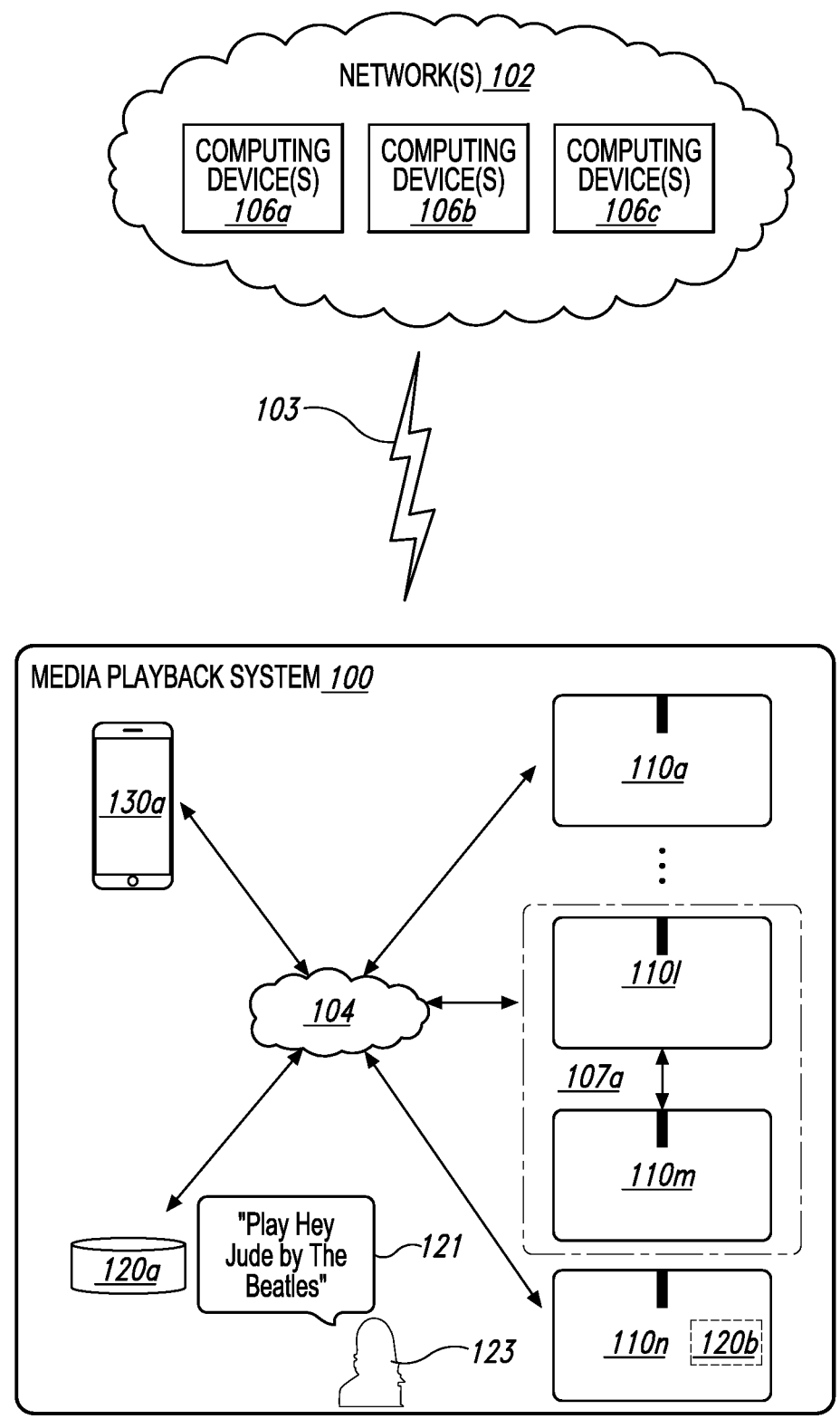
FIG. 1B is a schematic diagram of the media playback system of FIG. 1A and one or more networks, in accordance with an example.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g., voice input data) from the media playback system 100 and correspondingly transmit commands and/or media content to the media playback system 100.

The cloud network 102 comprises computing devices 106 (identified separately as a first computing device 106a, a second computing device 106b, and a third computing device 106c). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments, the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct connections, PANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices 110*l* and 110*m* comprise a group 107*a*. The playback devices 110*l* and 110*m* can be positioned in different rooms in a household and be grouped together in the group 107*a* on a temporary or permanent basis based on user input received at the control device 130*a* and/or another control device 130 in the media playback system 100. When arranged in the group 107*a*, the playback devices 110*l* and 110*m* can be configured to play back the same or similar audio content in synchrony from one or more audio content sources. In certain embodiments, for example, the group 107*a* comprises a bonded zone in which the playback devices 110*l* and 110*m* comprise left audio and right audio channels, respectively, of multi-channel audio content, thereby producing or enhancing a stereo effect of the audio content. In some embodiments, the group 107*a* includes additional playback devices 110. In other embodiments, however, the media playback system 100 omits the group 107*a* and/or other grouped arrangements of the playback devices 110. Additional details regarding groups and other arrangements of playback devices are described in further detail below with respect to FIGS. 1-I through 1M.

The media playback system 100 includes the NMDs 120*a* and 120*d*, each comprising one or more microphones configured to receive voice utterances from a user. In the illustrated embodiment of FIG. 1B, the NMD 120*a* is a standalone device and the NMD 120*d* is integrated into the playback device 110*n*. The NMD 120*a*, for example, is configured to receive voice input 121 from a user 123. In some embodiments, the NMD 120*a* transmits data associated with the received voice input 121 to a voice assistant service (VAS) configured to (i) process the received voice input data and (ii) transmit a corresponding command to the media playback system 100. In some aspects, for example, the computing device 106*c* comprises one or more modules and/or servers of a VAS (e.g., a VAS operated by one or more of SONOS®, AMAZON®, GOOGLE® APPLE®, MICROSOFT®). The computing device 106*c* can receive the voice input data from the NMD 120*a* via the network 104 and the links 103. In response to receiving the voice input data, the computing device 106*c* processes the voice input data (i.e., "Play Hey Jude by The Beatles"), and determines that the processed voice input includes a command to play a song (e.g., "Hey Jude"). The computing device 106*c* accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
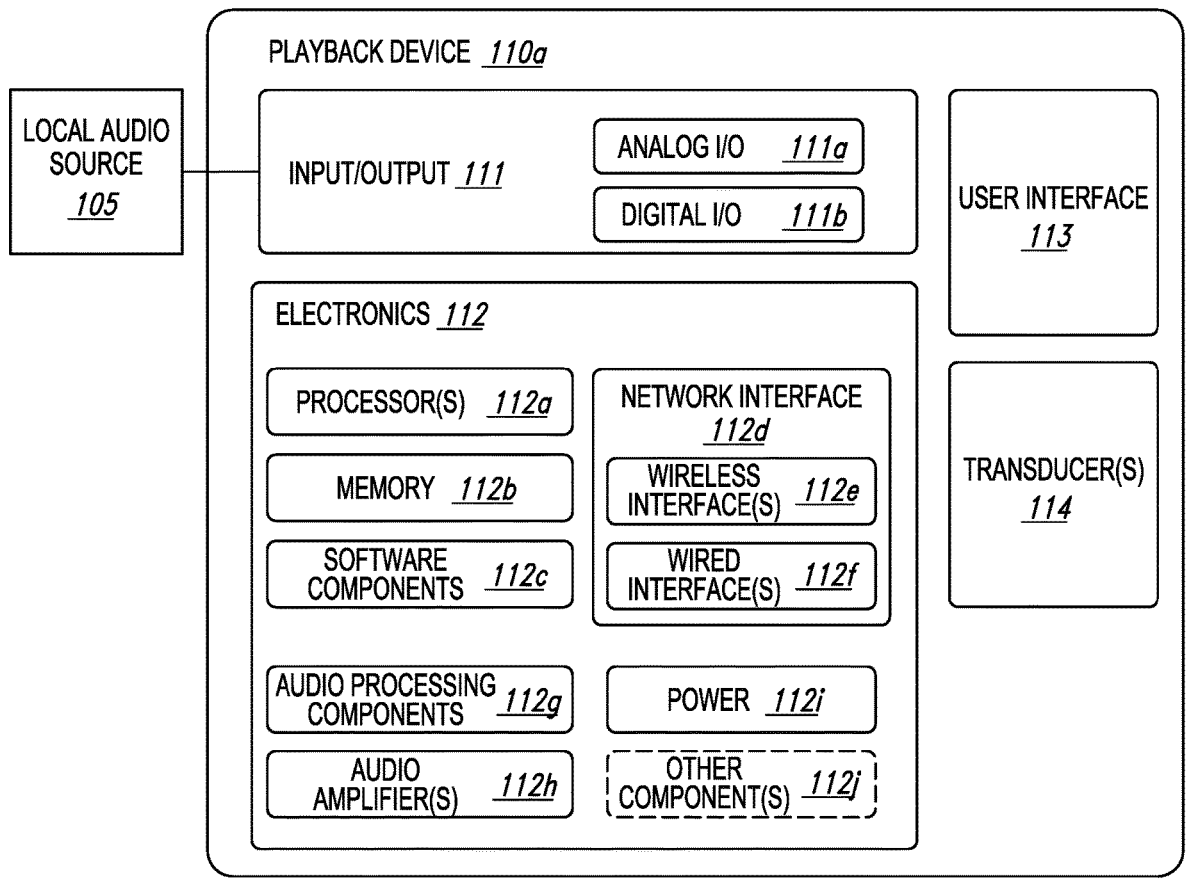
FIG. 1C is a block diagram of a playback device, in accordance with an example.

FIG. 1C is a block diagram of the playback device 110*a* comprising an input/output 111. The input/output 111 can include an analog I/O 111*a* (e.g., one or more wires, cables, and/or other suitable communication links configured to carry analog signals) and/or a digital I/O 111*b* (e.g., one or more wires, cables, or other suitable communication links configured to carry digital signals). In some embodiments, the analog I/O 111*a* is an audio line-in input connection comprising, for example, an auto-detecting 3.5 mm audio line-in connection. In some embodiments, the digital I/O 111*b* comprises a Sony/Philips Digital Interface Format (S/PDIF) communication interface and/or cable and/or a Toshiba Link (TOSLINK) cable. In some embodiments, the digital I/O 111*b* comprises a High-Definition Multimedia Interface (HDMI) interface and/or cable. In some embodiments, the digital I/O 111*b* includes one or more wireless communication links comprising, for example, a radio frequency (RF), infrared, WiFi, Bluetooth, or another suitable communication protocol. In certain embodiments, the analog I/O 111*a* and the digital 111*b* comprise interfaces (e.g., ports, plugs, jacks) configured to receive connectors of cables transmitting analog and digital signals, respectively, without necessarily including cables.

The playback device 110*a*, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110*a* does not include an input/output 111 and receives all audio content via the network 104.

The playback device 110*a* further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106*a-c* via the network 104 (FIG. 1B)), amplify the received audio, and output the amplified audio for playback via one or more of the transducers 114. In some embodiments, the playback device 110*a* optionally includes one or more microphones 115 (e.g., a single microphone, a plurality of microphones, a microphone array) (hereinafter referred to as "the microphones 115"). In certain embodiments, for example, the playback device 110*a* having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112*a* (referred to hereinafter as "the processors 112*a*"), memory 112*b*, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching amplifiers (e.g., Class-D power amplifiers). In other embodiments, however, the amplifiers include one or more other types of power amplifiers (e.g., Class-A amplifiers, Class-B amplifiers, Class-AB amplifiers, Class-C amplifiers, Class-D amplifiers, Class-E amplifiers, Class-F amplifiers, Class-G and/or class H amplifiers, and/or another suitable type of power amplifier). In certain embodiments, the amplifiers 112h comprise a suitable combination of two or more of the foregoing types of power amplifiers.

Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low-frequency transducers (e.g., subwoofers, woofers), mid-range frequency transducers (e.g., mid-range transducers, mid-woofers), and one or more high-frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
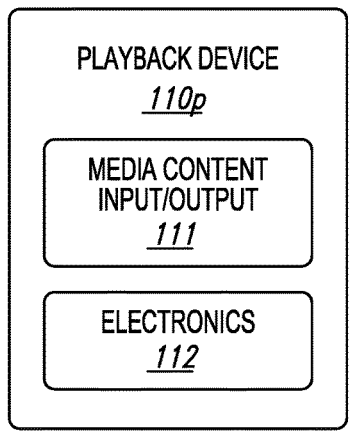
FIG. 1D is a block diagram of a playback device, in accordance with an example.

By way of illustration, SONOS, Inc. presently offers (or has offered) for sale certain playback devices including, for example, a "SONOS ONE," "PLAY:1," "PLAY:3," "PLAY:5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
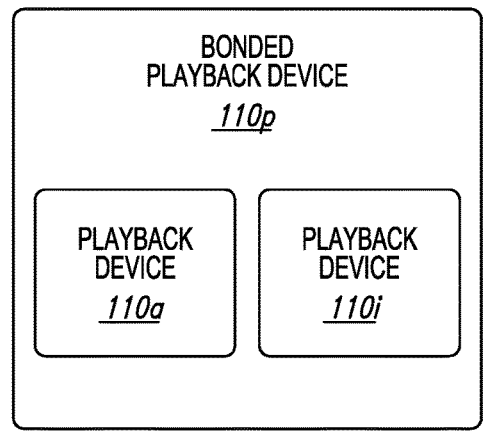
FIG. 1E is a block diagram of a network microphone device, in accordance with an example.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is a full-range playback device configured to render low frequency, mid-range frequency, and high-frequency audio content, and the playback device 110i is a subwoofer configured to render low-frequency audio content. In some aspects, the playback device 110a, when bonded with the first playback device, is configured to render only the mid-range and high-frequency components of particular audio content, while the playback device 110i renders the low-frequency component of the particular audio content. In some embodiments, the bonded playback device 110q includes additional playback devices and/or another bonded playback device.

c. Suitable Network Microphone Devices (NMDs)

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio components 112g (FIG. 1C), the amplifiers 114, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120a includes additional components (e.g., one or more sensors, cameras, thermometers, barometers, hygrometers).

In some embodiments, an NMD can be integrated into a playback device. FIG. 1G is a block diagram of a playback device 110r comprising an NMD 120d. The playback device 110r can comprise many or all of the components of the playback device 110a and further include the microphones 115 and voice processing 124 (FIG. 1F). The playback device 110r optionally includes an integrated control device 130c. The control device 130c can comprise, for example, a user interface (e.g., the user interface 113 of FIG. 1B) configured to receive user input (e.g., touch input, voice input) without a separate control device. In other embodiments, however, the playback device 110r receives commands from another control device (e.g., the control device 130a of FIG. 1B).

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Control Devices

FIG. 1H is a partially schematic diagram of the control device 130a (FIGS. 1A and 1B). As used herein, the term "control device" can be used interchangeably with "controller" or "control system." Among other features, the control device 130a is configured to receive user input related to the media playback system 100 and, in response, cause one or more devices in the media playback system 100 to perform an action(s) or operation(s) corresponding to the user input. In the illustrated embodiment, the control device 130a comprises a smartphone (e.g., an iPhone™, an Android phone) on which media playback system controller application software is installed. In some embodiments, the control device 130a comprises, for example, a tablet (e.g., an iPad™), a computer (e.g., a laptop computer, a desktop computer), and/or another suitable device (e.g., a television, an automobile audio head unit, an IoT device). In certain embodiments, the control device 130a comprises a dedicated controller for the media playback system 100. In other embodiments, as described above with respect to FIG. 1G, the control device 130a is integrated into another device in the media playback system 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processors 132a"), a memory 132b, software components 132c, and a network interface 132d. The processor 132a can be configured to perform functions relevant to facilitating user access, control, and configuration of the media playback system 100. The memory 132b can comprise data storage that can be loaded with one or more of the software components executable by the processor 302 to perform those functions. The software components 132c can comprise applications and/or other executable software configured to facilitate control of the media playback system 100. The memory 112b can be configured to store, for example, the software components 132c, media playback system controller application software, and/or other data associated with the media playback system 100 and the user.

The network interface 132d is configured to facilitate network communications between the control device 130a and one or more other devices in the media playback system 100, and/or one or more remote devices. In some embodiments, the network interface 132 is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132d can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone, and/or zone group configurations. For instance, based on user input received at the user interface 133, the network interface 132d can transmit a playback device control command (e.g., volume control, audio playback control, audio content selection) from the control device 130 to one or more of the playback devices 100. The network interface 132d can also transmit and/or receive configuration changes such as, for example, adding/removing one or more playback devices 100 to/from a zone, adding/removing one or more zones to/from a zone group, forming a bonded or consolidated player, separating one or more playback devices from a bonded or consolidated player, among others. Additional description of zones and groups can be found below with respect to FIGS. 1I through 1M.

The user interface 133 is configured to receive user input and can facilitate control of the media playback system 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit crossfade mode, etc. The playback control region 133d may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130a. In some embodiments, the one or more speakers comprise individual transducers configured to correspondingly output low frequencies, mid-range frequencies, and/or high frequencies. In some aspects, for example, the control device 130a is configured as a playback device (e.g., one of the playback devices 110). Similarly, in some embodiments, the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130a is configured to operate as a playback device and an NMD. In other embodiments, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones.

e. Suitable Playback Device Configurations

FIGS. 1-I through 1M show example configurations of playback devices in zones and zone groups. Referring first to FIG. 1M, in one example, a single playback device may belong to a zone. For example, the playback device 110g in the second bedroom 101c (FIG. 1A) may belong to Zone C. In some implementations described below, multiple playback devices may be "bonded" to form a "bonded pair" which together form a single zone. For example, the playback device 110l (e.g., a left playback device) can be bonded to the playback device 110l (e.g., a left playback device) to form Zone A. Bonded playback devices may have different playback responsibilities (e.g., channel responsibilities). In another implementation described below, multiple playback devices may be merged to form a single zone. For example, the playback device 110h (e.g., a front playback device) may be merged with the playback device 110i (e.g., a subwoofer), and the playback devices 110j and 110k (e.g., left and right surround speakers, respectively) to form a single Zone D. In another example, the playback devices 110g and 110h can be merged to form a merged group or a zone group 108b. The merged playback devices 110g and 110h may not be specifically assigned different playback responsibilities. That is, the merged playback devices 110h and 110i may, aside from playing audio content in synchrony, each play audio content as they would if they were not merged.

Each zone in the media playback system 100 may be provided for control as a single user interface (UI) entity. For example, Zone A may be provided as a single entity named Master Bathroom. Zone B may be provided as a single entity named Master Bedroom. Zone C may be provided as a single entity named Second Bedroom.

Playback devices that are bonded may have different playback responsibilities, such as responsibilities for certain audio channels. For example, as shown in FIG. 1-I, the playback devices 110l and 110m may be bonded to produce or enhance a stereo effect of audio content. In this example, the playback device 110l may be configured to play a left channel audio component, while the playback device 110k may be configured to play a right channel audio component. In some implementations, such stereo bonding may be referred to as "pairing."

Figures 1I, 1J:
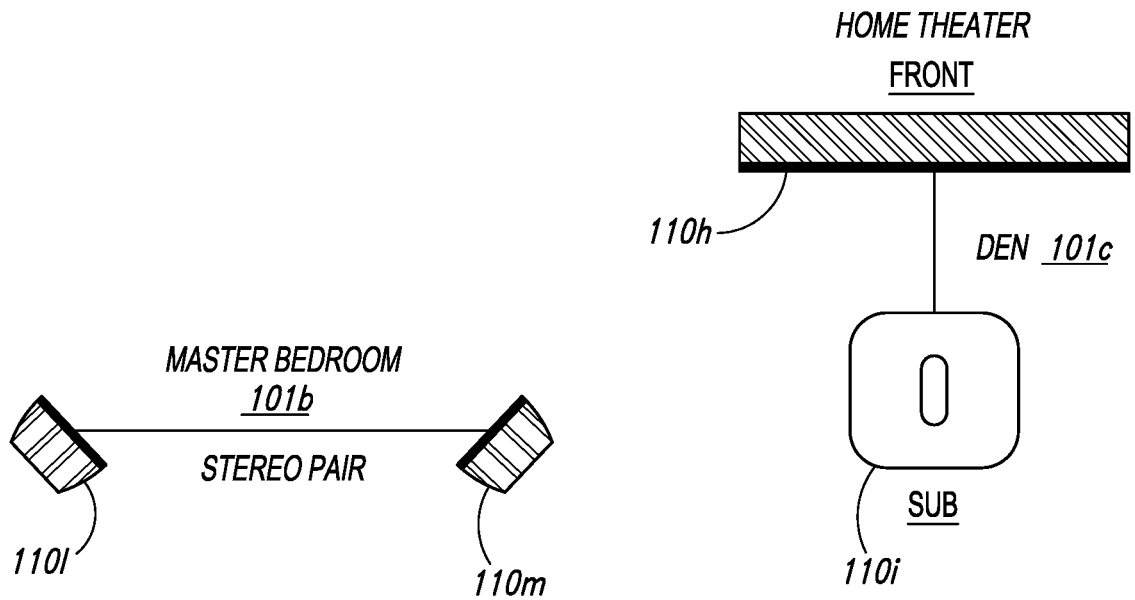
FIGS. 1I through 1L are schematic diagrams of corresponding media playback system zones, in accordance with an example.
Figures 1K, 1L:
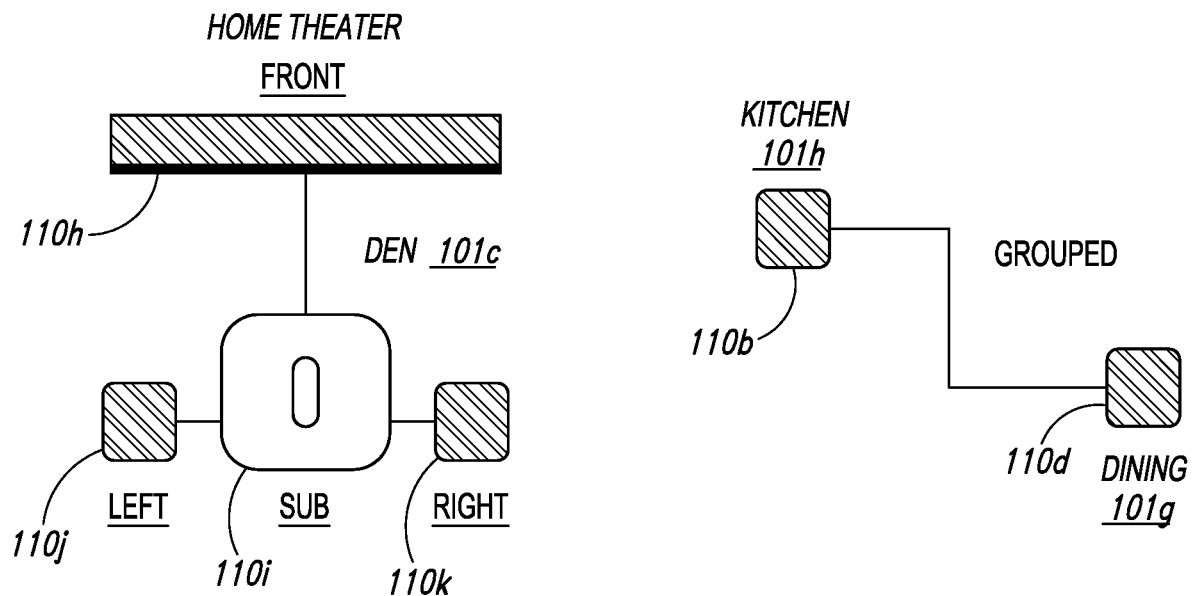
Figure 1M:
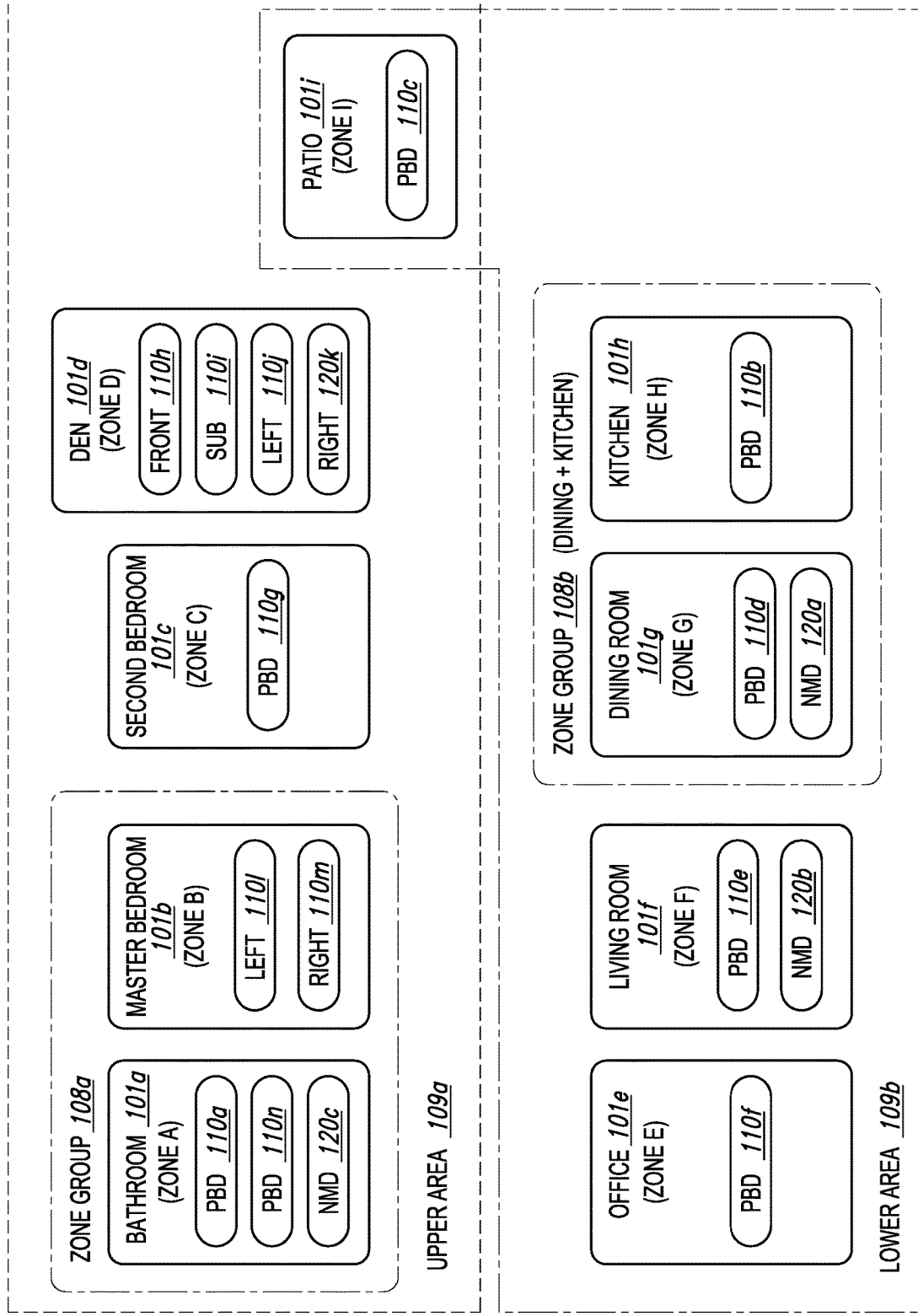
FIG. 1M is a schematic diagram of media playback system areas, in accordance with an example.

Additionally, bonded playback devices may have additional and/or different respective speaker drivers. As shown in FIG. 1J, the playback device 110h named Front may be bonded with the playback device 110i named SUB. The Front device 110h can be configured to render a range of mid to high frequencies, and the SUB device 110i can be configured to render low frequencies. When unbonded, however, the Front device 110h can be configured to render a full range of frequencies. As another example, FIG. 1K shows the Front and SUB devices 110h and 110i further bonded with Left and Right playback devices 110j and 110k, respectively. In some implementations, the Right and Left devices 110j and 102k can be configured to form surround or "satellite" channels of a home theater system. The bonded playback devices 110h, 110i, 110j, and 110k may form a single Zone D (FIG. 1M).

Playback devices that are merged may not have assigned playback responsibilities, and may each render the full range of audio content the respective playback device is capable of. Nevertheless, merged devices may be represented as a single UI entity (i.e., a zone, as discussed above). For instance, the playback devices 110a and 110n the master bathroom have the single UI entity of Zone A. In one embodiment, the playback devices 110a and 110n may each output the full range of audio content each respective playback device 110a and 110n are capable of, in synchrony.

In some embodiments, an NMD is bonded or merged with another device so as to form a zone. For example, the NMD 120b may be bonded with the playback device 110e, which together form Zone F, named Living Room. In other embodiments, a stand-alone network microphone device may be in a zone by itself. In other embodiments, however, a stand-alone network microphone device may not be associated with a zone. Additional details regarding associating network microphone devices and playback devices as designated or default devices may be found, for example, in previously referenced U.S. patent application Ser. No. 15/438,749.

Zones of individual, bonded, and/or merged devices may be grouped to form a zone group. For example, referring to FIG. 1M, Zone A may be grouped with Zone B to form a zone group 108a that includes the two zones. Similarly, Zone G may be grouped with Zone H to form the zone group 108b. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234,395. Playback devices may be dynamically grouped and ungrouped to form new or different groups that synchronously play back audio content.

In various implementations, the zones in an environment may be the default name of a zone within the group or a combination of the names of the zones within a zone group. For example, Zone Group 108b can be assigned a name such as "Dining+Kitchen," as shown in FIG. 1M. In some embodiments, a zone group may be given a unique name selected by a user.

Certain data may be stored in a memory of a playback device (e.g., the memory 112c of FIG. 1C) as one or more state variables that are periodically updated and used to describe the state of a playback zone, the playback device(s), and/or a zone group associated therewith. The memory may also include the data associated with the state of the other devices of the media system, and shared from time to time among the devices so that one or more of the devices have the most recent data associated with the system.

In some embodiments, the memory may store instances of various variable types associated with the states. Variables instances may be stored with identifiers (e.g., tags) corresponding to a type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, identifiers associated with the second bedroom 101c may indicate that the playback device is the only playback device of Zone C and not in a zone group. Identifiers associated with the Den may indicate that the Den is not grouped with other zones but includes bonded playback devices 110h-110k. Identifiers associated with the Dining Room may indicate that the Dining Room is part of the Dining+Kitchen zone group 108b and that devices 110b and 110d are grouped (FIG. 1L). Identifiers associated with the Kitchen may indicate the same or similar information by virtue of the Kitchen being part of the Dining+Kitchen zone group 108b. Other example zone variables and identifiers are described below.

In yet another example, the media playback system 100 may store variables or identifiers representing other associations of zones and zone groups, such as identifiers associated with Areas, as shown in FIG. 1M. An area may involve a cluster of zone groups and/or zones not within a zone group. For instance, FIG. 1M shows an Upper Area 109a including Zones A-D, and a Lower Area 109b including Zones E-I. In one aspect, an Area may be used to invoke a cluster of zone groups and/or zones that share one or more zones and/or zone groups of another cluster. In another aspect, this differs from a zone group, which does not share a zone with another zone group.

Further examples of techniques for implementing Areas may be found, for example, in U.S. application Ser. No. 15/682,506 filed Aug. 21, 2017, and titled "Room Association Based on Name," and U.S. Pat. No. 8,483,853 filed Sep. 11, 2007, and titled "Controlling and manipulating groupings in a multi-zone media system." Each of these applications is incorporated herein by reference in its entirety. In some embodiments, the media playback system 100 may not implement Areas, in which case the system may not store variables associated with Areas.

Figure 2:
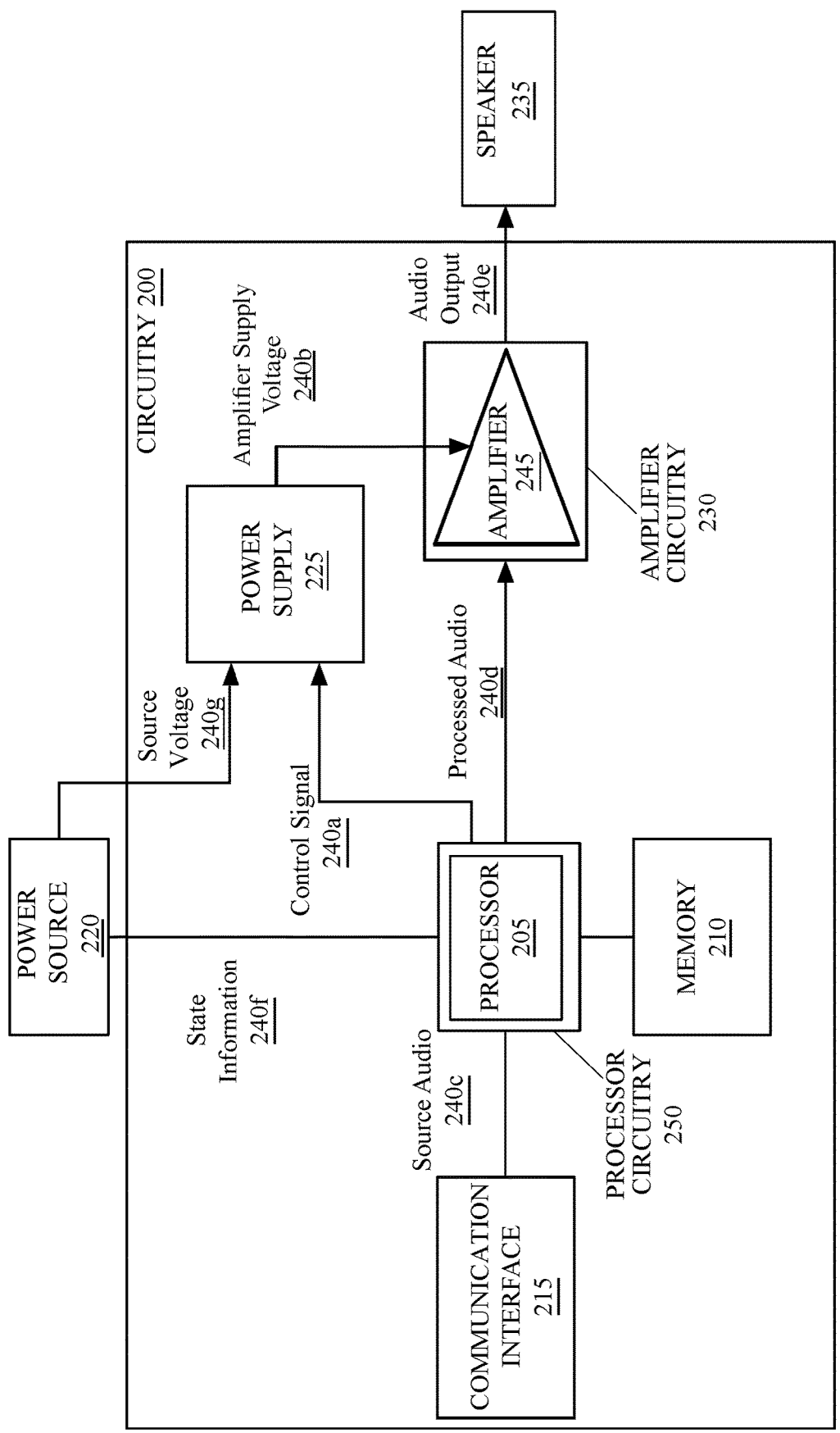
FIG. 2 illustrates a logical diagram of circuitry for a playback device, in accordance with an example.

III. Example Techniques for Improving the Power Efficiency of a Playback Device As noted above, the power efficiency of a playback device may be improved by, for example, varying a supply voltage for the audio amplifier based on the anticipated supply voltage required for upcoming audio. FIG. 2 illustrates an example of a logical diagram of circuitry 200 for a playback device that implements such power saving techniques. Preliminarily, it should be noted that the logical diagram of the circuitry 200 is provided to facilitate the description of various aspects of the disclosure and that it may not represent all the aspects of the circuity 200 for a particular playback device. In addition, the manner in which various components of the logical diagram are coupled can be different.

Referring to FIG. 2, the circuitry 200 is configured to receive power from a power source 220 and, using the power obtained from the power source 220, drive a speaker 235 with an audio output 240e based on source audio 240c. The circuitry 200 comprises a communication interface 215 that may facilitate communication with an external device to obtain the source audio 240c. The circuitry 200 further comprises processor circuitry 250 including a processor 205 that receives the source audio 240c from the communication interface 215 and generates processed audio 240d based on the source audio 240c. The processor circuitry 250 also generates a control signal 240a for a power supply 225 integrated into the circuitry 200 based on one or more of: (1) state information 240f regarding a state of the power source 220; (2) source audio 240c, or (3) processed audio 240d. The power supply 225 uses the source voltage 240g from the power source 220 to generate an amplifier supply voltage 240b for an amplifier 245 based on the control signal 240a. The circuitry 200 further comprises amplifier circuitry 230 that includes the amplifier 245 and is configured to generate an audio output 240e based on the processed audio 240d received from the processor circuitry 250.

It should be appreciated that one or more elements of the logical diagram of the circuitry 200 in FIG. 2 may correspond to one or more elements described above with regard to FIGS. 1C and/or 1F. For example, the processor 205, the communication interface 215, and the speaker 235 can respectively correspond to and/or perform one or more of the capabilities of the processor 112a, the network interface 112d, and the speaker 134 described above.

The power source 220 is configured to supply power to components of the circuitry 200. An example of the power source 220 can comprise a power input port of the playback device, such as an AC power port or a USB port (e.g., a USB TYPE-A port, a USB TYPE-B port, a USB TYPE-C port, etc.). The power input port can be coupled (e.g., via cable) directly to a household power outlet (e.g., to receive alternating current (AC) power) or indirectly via a power adapter (e.g., a device that converts the AC power from the household power outlet to direct current (DC) power).

The power source 220 can include a wireless power receiver that receives power wirelessly (e.g., via inductance, resonance, radiation, etc.) from an external wireless charger. For example, the power source 220 can comprise one or more concentrically arranged coils positioned along a surface of a housing of the playback device (e.g., a bottom surface, a top surface disposed opposite the bottom surface, and/or a lateral surface disposed between the top and bottom surfaces). In this example, the playback device may be disposed on a wireless charging base that wirelessly transfers power to the coils in the power source 220. It should be appreciated that the power source 220 may receive power wirelessly in accordance with any of a variety of wireless charging standards. Examples of such wireless charging standards include the QI standard developed by the WIRELESS POWER CONSORTIUM, the AIRFUEL RESONANT standard developed by AIRFUEL, and the AIRFUEL RF standard developed by AIRFUEL.

The power source 220 can include an energy harvester. Energy harvesters may include those devices configured to derive power from energy sources in the environment (e.g., solar energy, thermal energy, wind energy, salinity gradients, kinetic energy, etc.). For example, the power source 220 can include one or more photovoltaic cells configured to convert received light into a voltage. Any of a variety of energy harvester may be included in the power source 220. Examples of such energy harvesters include photovoltaic cells, thermoelectric generators, micro wind turbines, piezoelectric crystals, and kinetic energy harvesters.

The power source 220 can include a battery (e.g., a rechargeable battery) configured to store energy and to facilitate the portable operation of the playback device. In this regard, the battery can have a chemistry that facilitates recharging the battery, such as lithium-ion (Li-ion), nickel-metal hydride (NiMH), nickel-cadmium (NiCd), etc. The battery can be sized such that the circuitry 200 can operate on battery power alone for an extended amount of time without the battery needing to be recharged. For example, the battery can have a 20 watt-hours (Wh) capacity that facilitates continuous playback of audio for at least 4 hours on battery power alone. The battery can be charged using power from one or more other components in the power source 220 (e.g., power input port, wireless power receiver, energy harvester, etc.).

The power source 220 can include power circuitry configured to perform any of a variety of power related tasks including, for example, one or more of the following: (1) power conversion (e.g., AC-AC conversion, AC-DC conversion, DC-AC conversion, and/or DC-DC conversion); (2) power regulation; (3) battery charging; and/or (4) power monitoring (e.g., battery monitoring). Examples of electrical components that may be integrated into the power circuitry include transformers, rectifiers, inverters, converters, regulators, battery chargers, and/or power management integrated circuits (PMICs).

In some examples, the power circuitry can include battery circuitry that facilitates monitoring a state of a battery. In these examples, the battery circuitry can identify battery state information that includes information regarding one or more of the following battery states: a state-of-charge (SoC), temperature, age, and/or internal impedance. The battery circuitry can communicate the battery state information (e.g., as part of the state information 240*f*) to, for example, the processor circuitry 250.

The power circuitry can include regulation circuitry that facilitates converting a variable amount of voltage (e.g., a variable voltage from a battery, a variable voltage from an energy harvester, etc.) to a stable DC voltage. For example, the regulation circuity can include switching regulator circuitry such as buck, boost, buck-boost, flyback, resonant, etc. switching regulator circuitry. The regulation circuitry can include one or more linear voltage regulators such as low-dropout (LDO) regulators. The regulation circuitry can be configured to output one or more fixed DC voltages (e.g., ±5V, ±12V) or AC voltages.

Having described various example elements that may be included in the power source 220, it should be appreciated that the power source 220 may comprise any combination of elements. For example, the power source 220 may comprise any combination of the following: (1) one or more power ports; (2) one or more wireless power receivers; (3) one or more energy harvester; (4) one or more batteries; and/or (5) power circuitry (e.g., battery circuitry, regulation circuitry, etc.).

The power supply 225 is configured to receive power (e.g., source voltage 240*g*) from the power source 220 and to output a regulated voltage (e.g., amplifier supply voltage 240*b*) suitable for powering the amplifier 245. The power supply 225 can be implemented as a switch-mode power supply (SMPS). SMPSs may include those power supplies that, for example, use one or more switching regulators when outputting power to a load. Examples of SMPSs include: buck converters, boost converters, buck-boost converters, flyback converters, and resonant converters. Additionally, or alternatively, the power supply 225 can be implemented as a linear power supply that, for example, includes one or more linear regulators.

The power supply 225 can vary one or more output voltages (e.g., the amplifier supply voltage 240*b*) based on one or more reference inputs (e.g., control signal 240*a*). In this regard, the power supply 225 can include feedback circuitry configured to drive the output voltage of the power supply 225 to a particular value based on the value of the reference input. For example, the power supply 225 can output a voltage that equals or is proportional to the value of the reference input (e.g., 1× the reference input, 2× the reference input, ½ the reference input).

An example of the feedback circuitry can be configured to control a response time of the power supply 225. For example, the feedback circuitry can be configured to have an underdamped or critically damped response to minimize the amount of time it takes for the value of the output voltage to adjust to a new value based on a change in the value of the reference input. In another example, the feedback circuitry may have a damped response time to facilitate gradually changing the value of the output voltage when the value of the reference input changes.

The amplifier circuitry 230 is configured to generate an audio output 240*e* for the speaker 234 based on the processed audio 240*d* communicated from the processor circuitry 250. The amplifier circuitry 230 comprises an amplifier 245, such as a switching amplifier and/or a linear amplifier, that amplifies an audio signal associated with the processed audio 240*d* to facilitate generation of the audio output 240*e*. The amplifier 245 (and/or the entire amplifier circuitry 230) may be powered by the amplifier supply voltage 240*b* from the power supply 225. It should be appreciated that the amplifier 245 may be implemented as an amplifier other than a switching amplifier such as a linear amplifier (e.g., a Class-A, B, AB, or C amplifier). The amplifier 245 may be, for example, a single-channel amplifier (e.g., a mono-amplifier) or a multi-channel amplifier (e.g., a stereo-amplifier).

To facilitate proper operation of the amplifier 245 (i.e., the ability to amplify an audio input signal without significant distortion), the amplifier supply voltage 240*b* for the amplifier 245 may be higher than the amplitude of the highest expected audio output level of the amplifier 245. For example, the amplifier supply voltage 240*b* may be 10%, 15%, etc. higher than the amplitude of the highest expected audio output level. Some examples of the amplifier 245 may require the amplifier supply voltage 240*b* to be a minimum amount (e.g., 500 millivolts (mV), 1 Volt (V), 2 V, 3 V, etc.) higher than the amplitude of the highest expected audio output level. In other examples, the amplifier supply voltage 240*b* required for proper operation may be non-linearly related to the audio level. For example, the minimum amplifier supply voltage 240*b* needed by a particular amplifier 245 to output a 1 volt peak-to-peak voltage (Vp-p) signal may be 2 volts (i.e., 1 volt higher than the amplitude) and the minimum amplifier supply voltage 240*b* needed by the amplifier to output a 10 Vp-p signal may be 15 volts (i.e., 5 volts higher than the amplitude).

In some embodiments, the amplifier circuitry 230 may comprise additional components not illustrated in FIG. 2 (e.g., more than the amplifier 245). For example, the amplifier circuitry 230 can include a digital-to-analog converter (DAC). The amplifier 245 and the DAC can be integrated into a single integrated circuit (IC) die or implemented in separate IC dies (e.g., in separate packages, integrated into the same package, or unpackaged). The DAC can be configured to convert processed audio data 240*d* communicated from the processor 205 to an analog signal (e.g., for amplification by the amplifier 245). In some examples, the processed audio data 240*d* can be communicated from the processor 205 to the DAC in parallel via a data bus (e.g., 8-bit wide bus, 16-bit wide bus). In other examples, processed audio data 240*d* can be communicated from the processor circuitry 250 to the DAC in a serial manner. In this case, the DAC can include a serial-to-parallel converter to convert the serial processed audio data 240*d* to parallel processed audio data 240d to facilitate the conversion of the processed audio data 240d to an analog audio signal suitable for amplification.

The processor circuitry 250 may comprise one or more IC dies into which the processor 205 is integrated. As noted above, the processor 205 can correspond to or include the capabilities of the processor 112a described above. The processor 205 may comprise one or more general-purpose processors (GPP) and/or one or more special-purpose processors (e.g., a digital signal processor (DSP)). The processor circuitry 250 can further include various types of interfaces that facilitate communications with other components of the circuitry 200. For example, the processor circuitry 250 can include a control signal output that facilitates communicating a control signal 240a to a reference voltage input of the power supply 225. Adjustment of the control signal 240a can facilitate adjustment of the amplifier supply voltage 240b that is output from the power supply 225.

An example of the processor circuitry 250 can include an interface that facilitates communicating information with the power source 220. For example, the processor circuitry 250 can include an I²C bus interface that can be utilized to communicate state information 240f that specifies, for example, the temperature, age, impedance, etc., of a battery of the power source 220.

An example of the processor circuitry 250 can include one or more interfaces that facilitate communicating processed audio data 240d to the amplifier circuitry 230. For example, the processor circuitry 250 can include an analog output interface that facilitates communicating an analog audio signal directly to the amplifier circuitry 230. The processor circuitry 250 can include one or more interfaces that facilitate digitally communicating processed audio data 240d in parallel via a data bus (e.g., 8, 16, or 32-bit wide bus), in serial, or in some combination of serial and parallel to, for example, a DAC. For example, the processor circuitry 250 may comprise an I2S interface and/or an I2C interface to communicate the processed audio 240d to the amplifier circuitry 230.

An example of the processor circuitry 250 can include an interface that facilitates receiving information from the network interface 215. The information can include source audio data 240c received by the circuitry 200 from another playback device, an audio source (e.g., stereo, television, etc.), a control device, or a different device.

As noted above, the processor 205 can be in communication with the memory 210. The memory 210 can store instruction code that is executable by the processor 205 for causing the processor circuitry 250 to implement or facilitate performing various operations. Operations associated with the present disclosure are described in further detail below. The memory 210 (or any portion thereof) may be integrated into the processor circuitry 250 or separate from the processor circuitry 250. Further, the memory 210 (or any portion thereof) and the processor 205 may be integrated into the same IC die (e.g., the processor 205 and memory 210 may be integrated into a single system-on-a-chip (SoC)) or implemented in separate IC dies (e.g., in separate packages, integrated into the same package, or unpackaged).

Figure 3:
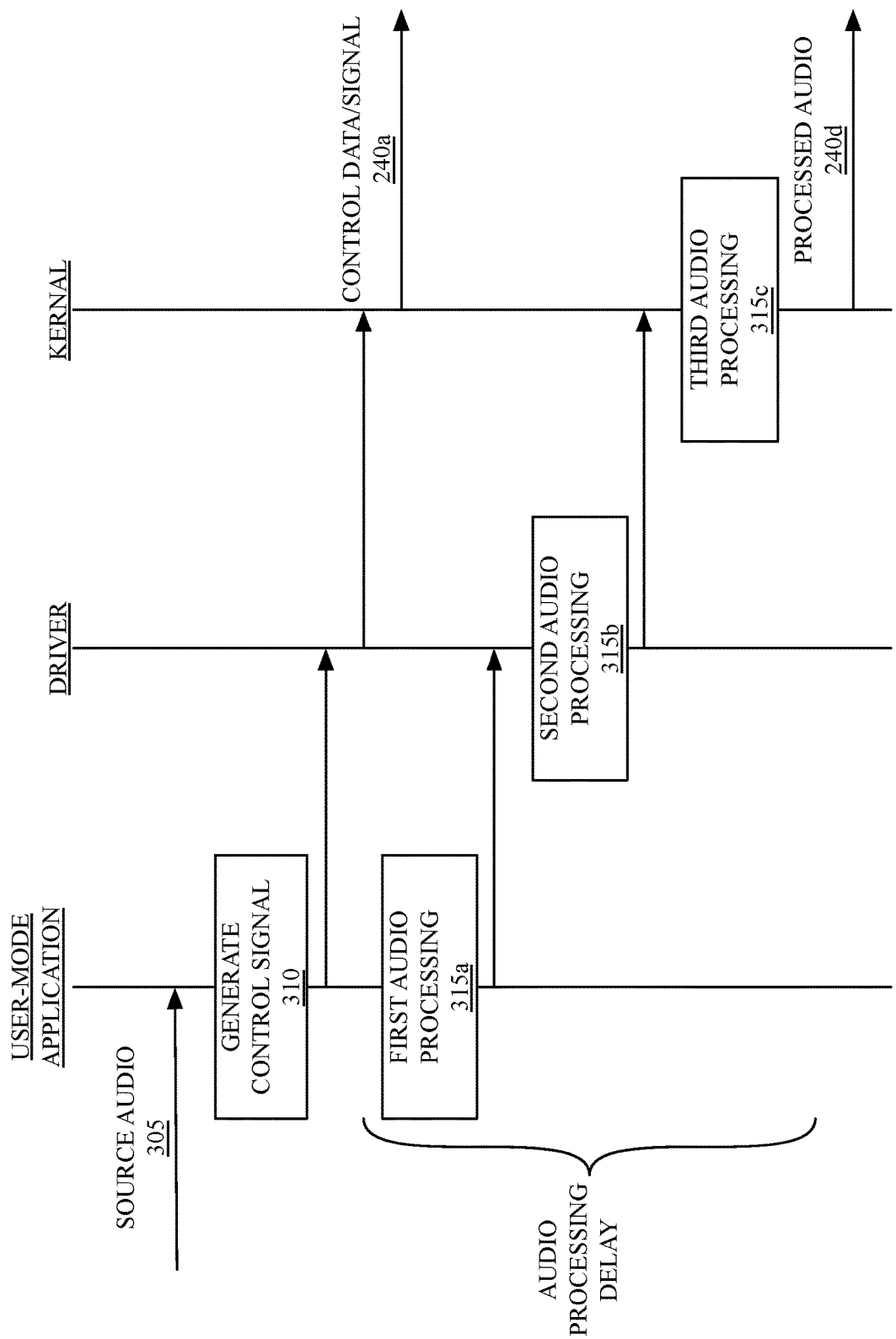
FIG. 3 illustrates operations that can be performed to generate a control signal for a power supply to vary an amplifier supply voltage, in accordance with an example.

FIG. 3 illustrates examples of operations that can be performed by the processor circuitry 250 to facilitate the generation of the control signal 240a referred to above for controlling the power supply 225 to output an amplifier supply voltage 240b of a particular level. The operations can be performed by one or more applications (e.g., executed by the processor 205) operating within an operating system (e.g., executed by the processor 205) that facilitates the execution of applications at different abstraction layers (e.g., user-mode, driver, kernel). Within examples, the operating system can correspond to RT Linux, VX Works, OSE, etc. Kernel-mode applications can be operated in regions of memory that are protected from user-mode applications. Operations implemented by the kernel-mode applications can involve direct access to hardware modules of the processor circuitry 250. User-mode applications can operate in regions of memory that are protected from other user-mode applications, and may not be capable of directly performing operations that involve direct hardware access. Driver applications can be implemented at the kernel level, the user level, or both the kernel level and the user level. Driver applications can serve as a bridge between user-mode applications and the hardware and/or as a bridge to kernel applications, which in turn can access the hardware.

It should be understood that in other implementations, the operations illustrated in FIG. 3 can be performed in the same abstraction layer. For example, the operations can all be performed in the kernel layer of the operating system.

Referring to FIG. 3, operation 305 can involve receiving, by a user-mode application, source audio 240c. For example, the user-mode application can receive the source audio 240c from a driver (not shown) that is configured to receive source audio 240c from the communication interface 215. The source audio 240c can correspond to 8, 16, or 32 bit wide audio samples. The source audio 240c can correspond to audio data received from an audio source (e.g., stereo, television, etc.). The source audio 240c may be in an encoded format that is encoded in accordance with one or more audio codecs such as MP3, AAC, and/or HE-AAC codecs or may be in an unencoded format such as pulse-code modulation (PCM).

Operation 310 can involve generating, by the user-mode application, control data associated with the control signal 240a for controlling the power supply 225 to output an amplifier supply voltage 240b of a particular level. In this regard, the user-mode application can communicate the control data (e.g., via a driver application and/or a kernel application) to the control signal output of the processor circuitry 250. The processor circuitry 250 can be configured to convert the control data to one or more signals (e.g., including a pulse width modulation (PWM) signal) that can be communicated (directly or indirectly) to the reference voltage input of the amplifier power supply 225. In should be noted that in alternative implementations, the user-mode application may communicate the control data directly to the kernel application, or that operation 310 can be implemented entirely in a kernel application.

Operations 315a, 315b, and 315c can involve processing the source audio 240c to provide processed audio 240d. Within examples, processing of the source audio 240c can involve decoding (e.g., decoding the source audio 240c from an encoded format to an unencoded and/or uncompressed format), equalization (e.g., increasing or decreasing the levels of different frequencies in the source audio 240c), compression (e.g., reducing the dynamic range of the source audio 240c), expansion (e.g., expanding the dynamic range of the source audio 240c), and/or limiting (e.g., constraining the level of the source audio 240c to a specified threshold). By way of example, the audio processing delay associated with the performance of the operations performed between receiving the source audio 240c and outputting the processed audio 240d can take in the range of 10 ms-50 ms. The amount of time can depend on factors such as the amount of processing performed and the speed at which the processor can process instructions. It should be noted that while the processing operations 315a, 315b, and 315c are depicted as spanning multiple abstraction layers, in other implementations, the processing operations 315a, 315b, and 315c can be performed in the same abstraction layer.

As shown in FIG. 3, the operation 310 of generating the control signal can be performed at least partially in parallel with the source audio 240c being processed and/or the processed audio 240d being output. Performing such operations at least partially in parallel may advantageously allow a feedforward control signal, such as the control signal 240a in certain examples, to be generated without needing to explicitly incorporate delay into the audio signal path (e.g., explicitly incorporating an additional delay in the audio processing 315a-315c and/or an additional delay between the processed audio 240d being output by the processor 205 and the speaker 235). For example, the user-mode application may generate data indicative of the values that should be output as the processed audio 240d in operation 315a for a given chunk of audio and provide that data to the audio driver. Once that data for a given chunk of audio is provided to the audio driver, the audio driver and/or the kernel may need to perform one or more operations (shown as the second and third audio processing 315b and 315c, respectively) before a signal is actually output on a port by the processor circuitry 250. In this example, the user-mode application may leverage the audio processing delay for the second and/or third audio processing 315b and 315c, respectively, to perform operation 310 and generate the control signal. The time required to generate the control signal in operation 310 may be less (e.g., milliseconds less) than the time required for the second and third audio processing 315b and 315c respectively. Thus, the control signal 240a can be generated so as to account for disturbances (e.g., events that require a large swing in the amplifier supply voltage 240b) in the audio that have not been output by the processor circuitry 250.

Figure 4A:
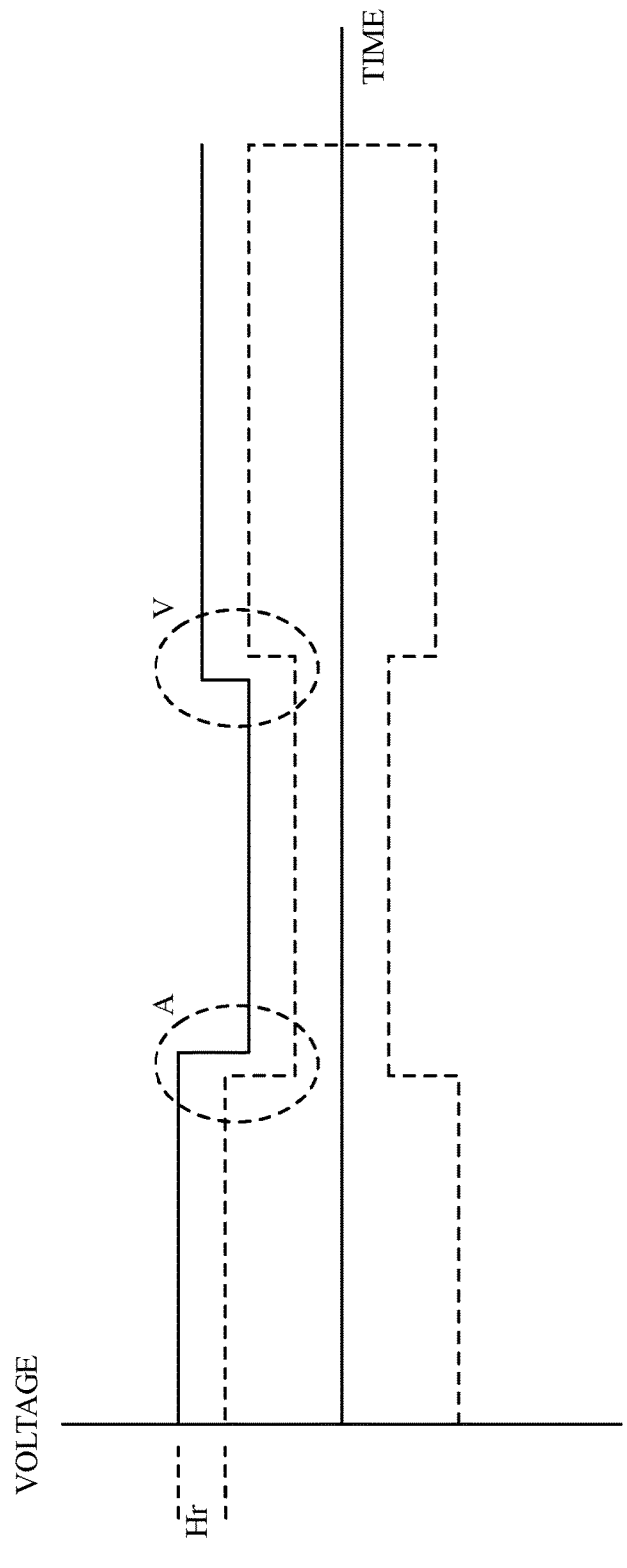
FIG. 4A illustrates a first manner in which the control signal can be configured to control the power supply to output an amplifier supply voltage, in accordance with an example.
Figure 4B:
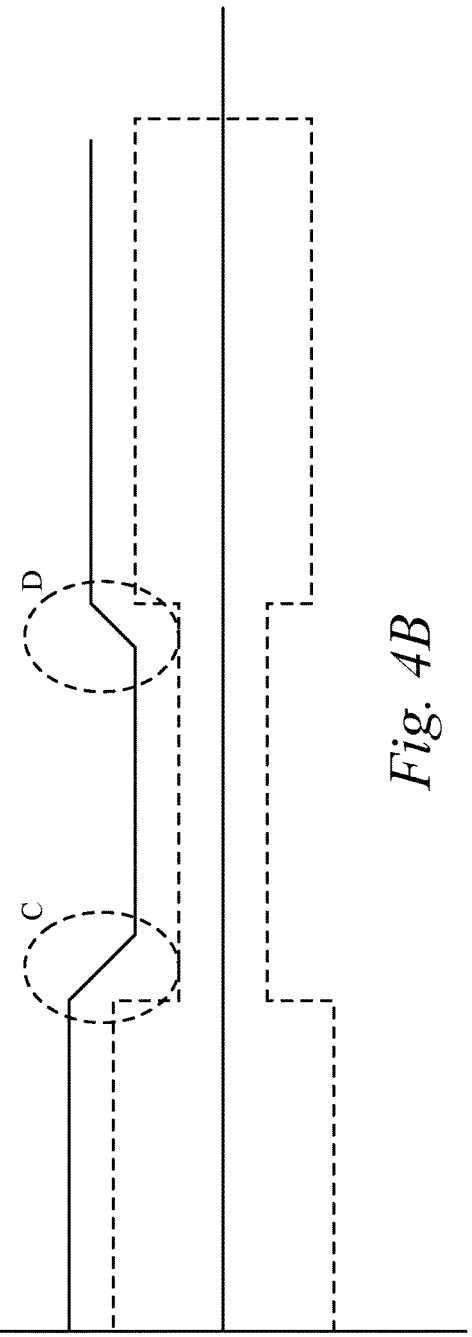
FIG. 4B illustrates a second manner in which the control signal can be configured to control the power supply to output an amplifier supply voltage, in accordance with an example.
Figure 4C:
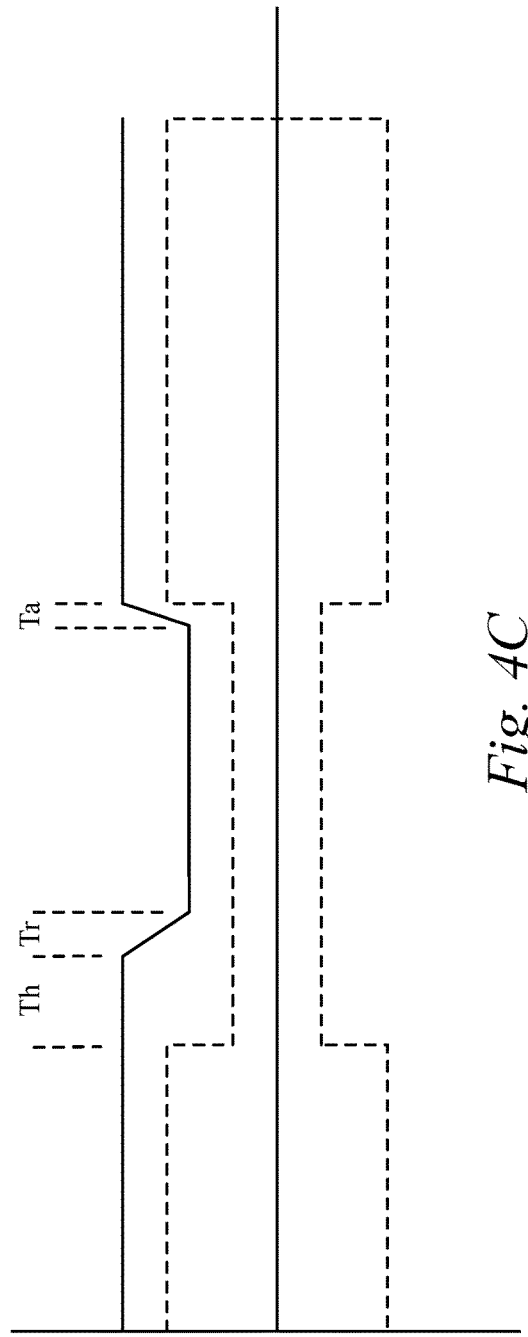
FIG. 4C illustrates a third manner in which the control signal can be configured to control the power supply to output an amplifier supply voltage, in accordance with an example.

FIGS. 4A-4C illustrate various schemes the processor circuitry 250 (e.g., processor 205 executing a user-mode application) can employ, via the control signal in operation 310, to adjust the amplifier supply voltage 240b to improve the power efficiency of the circuitry 200. In FIGS. 4A-4C, the solid line represents the amplifier supply voltage 240b, and the dashed lines represent the envelope of the voltage of the audio output signal 240e output from the amplifier circuitry 230 to the speaker 235. The top portion of the envelope can correspond to the minimum amplifier supply voltage 240b required to facilitate proper (i.e., non-distorted) amplification of the processed audio 240d by an ideal amplifier. The difference between the solid line (e.g., representing the amplifier supply voltage 240b) and the dashed line (e.g., representing the envelope of the voltage of the audio output signal 240e) is the voltage headroom, which is shown as "Hr."

Referring to FIG. 4A, in an example, the processor circuitry 250 can adjust the control signal 240a to cause the power supply 225 to output an amplifier supply voltage 240b that is a fixed amount above the minimum voltage level required by the amplifier 230 to facilitate amplification of the processed audio 240d. For example, the control signal 240a can be configured to adjust the amplifier supply voltage 240b to be an absolute amount (e.g., Hr=1 Volt) above the minimum required amplifier supply voltage 240b. In some examples, the control signal 240a can be configured to adjust the amplifier supply voltage 240b to be a percentage above (e.g., 5%, 10%) the minimum required amplifier supply voltage 240b.

In some examples, the control signal 240a can be configured to delay the transition of the amplifier supply voltage 240b or to transition the amplifier supply voltage 240b early. For example, in region A, the audio output 240e may drop and, therefore, the amplifier supply voltage 240b required for amplification may be reduced. In this case, the control signal 240a can be configured to maintain the amplifier supply voltage 240b for a particular amount of time (e.g., 5 ms) and then to lower the amplifier supply voltage 240b afterward. At region B, the audio output 240e may increase, and, therefore, the amplifier supply voltage 240b required for amplification may be increased. In this case, the control signal 240a can be configured to preemptively increase the amplifier supply voltage 240b early (e.g., 5 ms). In this regard, the audio processing delay incurred between the generation of the control signal 240a and outputting of the processed audio 240d (see FIG. 3) can facilitate the preemptive adjustment of the amplifier supply voltage 240b. For example, an audio processing delay of, for example, 40 ms may facilitate preemptive adjustment of the amplifier supply voltage 240b up to about 40 ms before the processed audio 240d is communicated to the amplifier 230.

In FIG. 4A, the control signal 240a abruptly adjusts the amplifier supply voltage 240b between voltage levels. As shown in FIG. 4B, in another example, the control signal 240a can be configured to gradually adjust the amplifier supply voltage 240b between voltage levels. For example, as shown in regions C and D, the control signal 240a can be configured to slew rate limit (e.g., 0.5 Volts/ms) the amplifier supply voltage 240b to limit the rate of change of the amplifier supply voltage 240b.

As shown in FIG. 4C, in another example, the control signal 240a can be configured such that the amplifier supply voltage 240b has particular attack (Ta), hold (Th), and release (Tr) times. The attack time (Ta) corresponds to an amount of time, before an expected increase in the amplitude of the audio output 240e, taken to increase the amplifier supply voltage 240b to the minimum amplifier supply voltage 240b required to facilitate proper operation of the amplifier 230. The hold time (Th) corresponds to an amount of time, after an expected decrease in the amplitude of the audio output 240e, that the amplifier supply voltage 240b maintains its value. The release time (Tr) corresponds to an amount of time, after the hold time (Th), taken to lower the amplifier supply voltage 240b to the minimum amplifier supply voltage 240b required to facilitate proper operation of the amplifier 230. The attack time (Ta) can be set to facilitate quickly increasing the amplifier supply voltage 240b in response to expected increases in the amplitude of the audio output 240e. The hold (Th), and release (Tr) times can be set to delay decreasing the amplifier supply voltage 240b in response to expected decreases in the amplitude of the audio output 240e. For example, the attack time, Ta, can be set to a relatively short value (e.g., 1 ms), to facilitate a rapid increase in the amplifier supply voltage when the amplitude of the audio output 240e is expected to increase. The hold and release times can be set to somewhat longer values (e.g., 5 ms) to delay decreasing the amplifier supply voltage 240b. This may be beneficial in instances where the amplitude of the audio output 240e is expected to modulate somewhat quickly between low and high amplitudes because the rapid adjustment of the amplifier supply voltage 240b in these cases may actually reduce the overall efficiency of the circuitry 200. Appropriate specification of attack (Ta), hold (Th), and release (Tr) times for the control signal 240a can mitigate this issue.

In addition to the aspects above, the control signal 240a can be configured to adjust the amplifier supply voltage 240b responsive to other parameters. For example, the control signal 240a can be configured to increase the amount of headroom necessary for proper operation of the amplifier 230 in response to the temperature, age, impedance, and/or load exhibited on the battery. In this regard, the control signal 240a can be configured to increase the amplifier supply voltage 240b in proportion to the other parameters. For example, in addition to the adjustments described in FIGS. 4A-4C, the amplifier supply voltage 240b can be further increased by 5% to compensate for a 5% increase in the load, temperature, and/or impedance of the battery, or a 5% decrease in the age of the battery. The amount and/or percentage of the increase or decrease can be different for each type of parameter. The rate at which the amplifier supply voltage 240b is adjusted to compensate for changes in these parameters can be determined differently. For example, a lookup table may specify the amount of increase or decrease to apply to the amplifier supply voltage 240b for particular values associated with these parameters.

Figure 5:
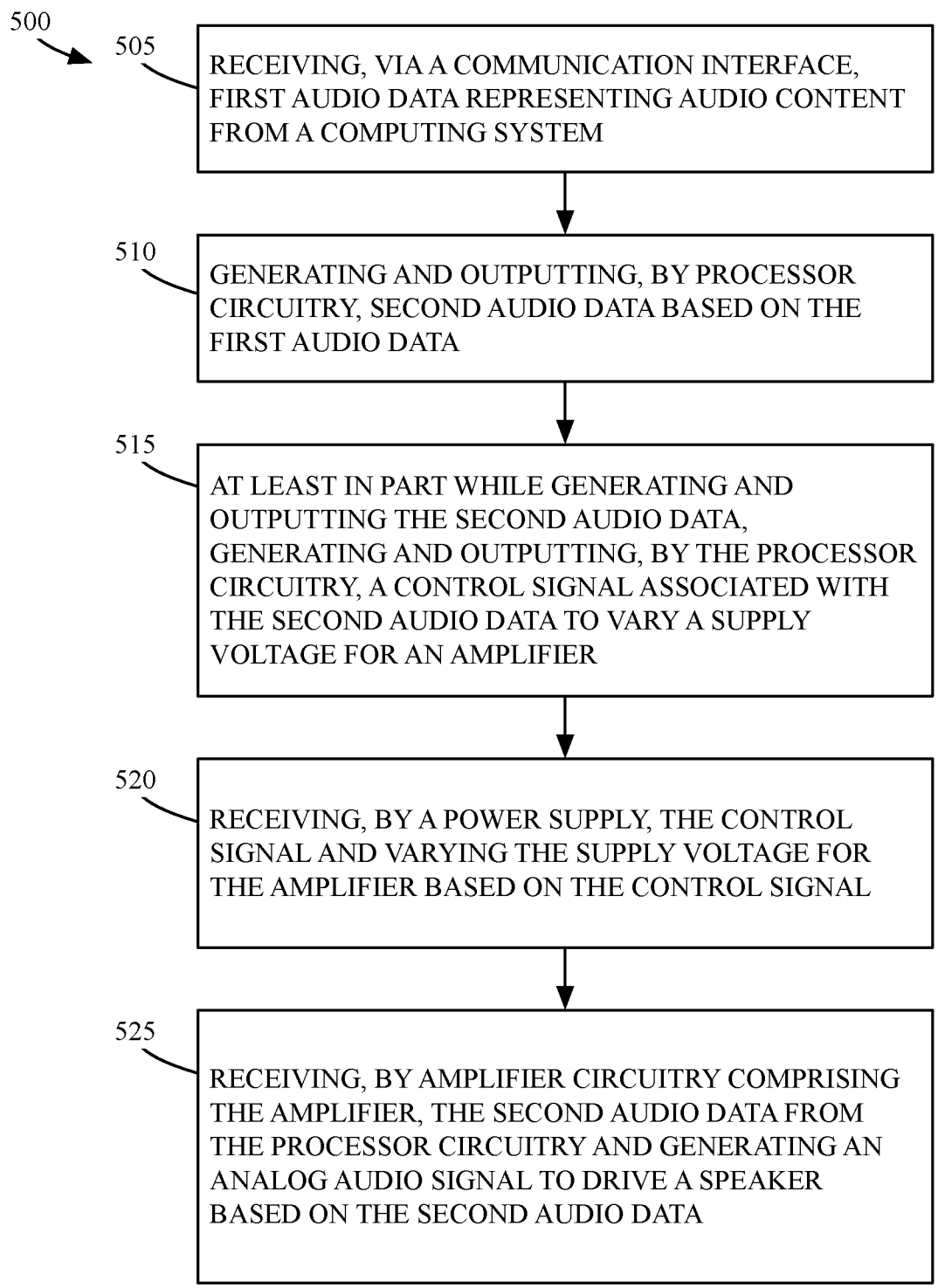
FIG. 5 illustrates a variation of the operations performed by a playback device, in accordance with an example.

FIG. 5 illustrates examples of operations 500 that may be performed by, for example, a playback device and/or circuitry for integration into a playback device (e.g., circuitry 200 shown in FIG. 2). Block 505 can involve receiving, via a communication interface (e.g., communication interface 215), first audio data (e.g., source audio 240c) representing audio content from a computing system. In one example, the first audio data may be received via a wireless local area network (WLAN) from one or more servers associated with a music service provider (e.g., SPOTIFY, APPLE MUSIC, PANDORA, etc.). In another example, the first audio data may be received via a BLUETOOTH network from a user device. The first audio data may be in an encoded format (e.g., in accordance with one or more codecs) or may be in an unencoded or otherwise uncompressed format.

Block 510 can involve generating and outputting, by processor circuitry (e.g., processor circuitry 250), second audio data (e.g., processed audio 240d) based on the first audio data. Additionally (or alternatively), the second audio data may be generated based on state information (e.g., state information 240f) associated with a power source (e.g., power source 220). In some implementations, one or more audio characteristics (e.g., volume, dynamic range, etc.) may be modified to adjust the power required for playback based on the state information. For example, the power source may comprise a battery and the one or more audio characteristics may be modified to reduce the power required for playback (e.g., reduce volume, reduce dynamic range, etc.) when one or more of the following conditions occur: (1) the battery voltage falls below a threshold; (2) the internal impedance of the battery is above a threshold; (3) the age of the battery is above a threshold; and/or (4) the state-of-charge (SoC) of the battery falls below a threshold.

Block 515 can involve at least in part while generating and outputting the second audio data, generating and outputting, by the processor circuitry, a control signal (e.g., control signal 240a) associated with the second audio data to vary a supply voltage (e.g., amplifier supply voltage 240b) for an amplifier (e.g., amplifier 245 in amplifier circuitry 230). Additionally (or alternatively), the control signal may be generated based on state information (e.g., state information 240f) associated with the power source (e.g., power source 220). In some implementations, the amount of voltage headroom provided to the amplifier for a given section of audio may be adjusted based on the state information. For example, the amount of voltage headroom may be increased as the internal impedance of the battery increases and/or the age of the battery increases.

Block 520 can involve receiving, by a power supply (e.g., power supply 225), the control signal from the processor circuitry. The power supply can vary the supply voltage for the amplifier based on the control signal. The control signal may comprise one or more analog signals and/or on or more digital signals that communicate (directly or indirectly) a target output supply voltage to the power supply. For example, the control signal may comprise a PWM signal where the characteristics of the pulses (e.g., pulse-width, pulse density, etc.) denote a desired target supply voltage. In some examples, PWM signal may be directly communicated to the power supply (e.g., the power supply directly receives the PWM signal). In other examples, the PWM signal may be filtered (e.g., by a low-pass filter) to generate an analog signal where the desired target supply voltage is denoted by an amplitude of the analog signal (e.g., instead of the characteristics of the pulses). In these examples, the analog signal generated by the filtered PWM signal may be provided to the power supply.

Block 525 can involve receiving, by amplifier circuitry (e.g., amplifier circuitry 230) comprising the amplifier, the second audio data from the processor circuitry and generating (e.g., using the amplifier) an analog audio signal (e.g., audio output 240e) to drive a speaker (e.g., speaker 235) based on the second audio data.

In some examples, the second audio data comprises a digital audio signal, wherein the amplifier circuitry further comprises a digital-to-analog converter (DAC) coupled in series with the amplifier. The amplifier circuitry may be integrated into one or more IC dies (e.g., a single IC die, two IC dies, etc.). For example, the DAC may be integrated into the same IC die as the amplifier or the DAC and the amplifier may be integrated into separate IC dies that are communicatively coupled (e.g., using conductive traces, bonding wires, vias, etc.).

In some examples, the supply voltage tracks an amplifier audio output voltage associated with the analog audio signal and has a value of between 0.1% and 35% greater than the amplifier audio output voltage. For instance, the value of the supply voltage may be between: (1) 0.1% and 30%; (2) 0.1% and 25%; (3) 0.1% and 20%; (4) 0.1% and 15%; (5) 0.1% and 10%; (6) 0.1% and 5%; (7) 0.1% and 2.5%; and/or (8) 0.1% and 1% greater than the amplifier audio output voltage.

In some examples, the control signal may be generated such that a maximum frequency of the supply voltage is between 0.1 Hz and about 20 kHz. For instance, the control signal may be generated such that the maximum frequency of the supply voltage may be between: (1) 0.1 Hz and 15 kHz; (2) 0.1 Hz and 10 kHz; (3) 0.1 Hz and 5 kHz; (4) 0.1 Hz and 1 kHz; (5) 0.1 Hz and 500 Hz; (6) 0.1 Hz and 100 Hz; (7) 0.1 Hz and 10 Hz; and/or (8) 0.1 Hz and 1 Hz.

In some examples, a power source is coupled to the power supply. The power source can include at least one of: an energy harvester, a battery, a wireless power receiver, or a power input port.

Some examples can involve receiving, by the processor circuitry, information indicative of at least one state of the power source. The processor circuitry can be configured to generate the control signal (and/or the second audio data) based on the at least one state of the power source.

In some examples, the power source includes the battery. In these examples, the at least one state of the power source can comprise at least one of: a temperature of the battery, a state-of-charge of the battery, an age of the battery, a load on the battery, or an internal impedance of the battery.

In some examples, the power supply comprises an SMPS. The SMPS can comprise, for example, at least one of: a boost converter, a buck converter, a buck-boost converter, a flyback converter, or a resonant converter.

In some examples, the processor circuitry is configured to forecast the value of the supply voltage to the amplifier. In these examples, the processor circuitry can be configured to adjust an amplitude associated with the second audio data based on the forecasted value of the supply voltage. For example, it may have been previously determined that the response time of the power supply is not fast enough to raise the amplifier supply voltage to a particular value needed for proper amplification by a particular time. In this case, the processor circuitry can reduce or compress the amplitude of the second audio data to minimize or prevent distortion of the second audio data by the amplifier. In other examples, a signal representative of the actual amplifier supply voltage may be input to the processor circuitry via an interface of the processor circuitry. The processor circuitry can determine, based on the representative signal, that compression of the amplitude of the second audio data is required to prevent distortion.

While the examples above have been described with reference to a playback device, it is contemplated that the aspects above can be embodied in a circuit module. For example, a module for a first playback device can include at least one circuit board. A communication interface can be attached to (e.g., arranged on, mounted to, affixed to, embedded in, etc.) the at least one circuit board and can be configured to facilitate communication via at least one network. Processor circuitry (comprising at least one processor) can be attached to the at least one circuit board and coupled to the communication interface. At least one non-transitory computer-readable medium can be attached to the at least one circuit board and coupled to the at least one processor.

The computer-readable medium can store program instructions that are executable by the at least one processor such that the processor circuitry is configured to receive, via the communication interface, first audio data representing audio content from a computing system. The processor circuitry can generate and output second audio data based on the first audio data, and at least in part while generating and outputting the second audio data, generate and output a control signal associated with the second audio data to vary a supply voltage for an amplifier (e.g., a Class-D amplifier).

A power supply (e.g., an SMPS) can be attached to the at least one circuit board and coupled to the processor circuitry. The power supply can be configured to receive the control signal from the processor circuitry and to vary the supply voltage for the amplifier based on the control signal.

Amplifier circuitry can be attached to the at least one circuit board and coupled to the processor circuitry and the power supply. The amplifier circuitry can include the amplifier powered by the supply voltage from the power supply. The amplifier circuitry can be configured to receive the second audio data from the processor circuitry and to generate an analog audio signal to drive a speaker based on the second audio data.

Figure 6:
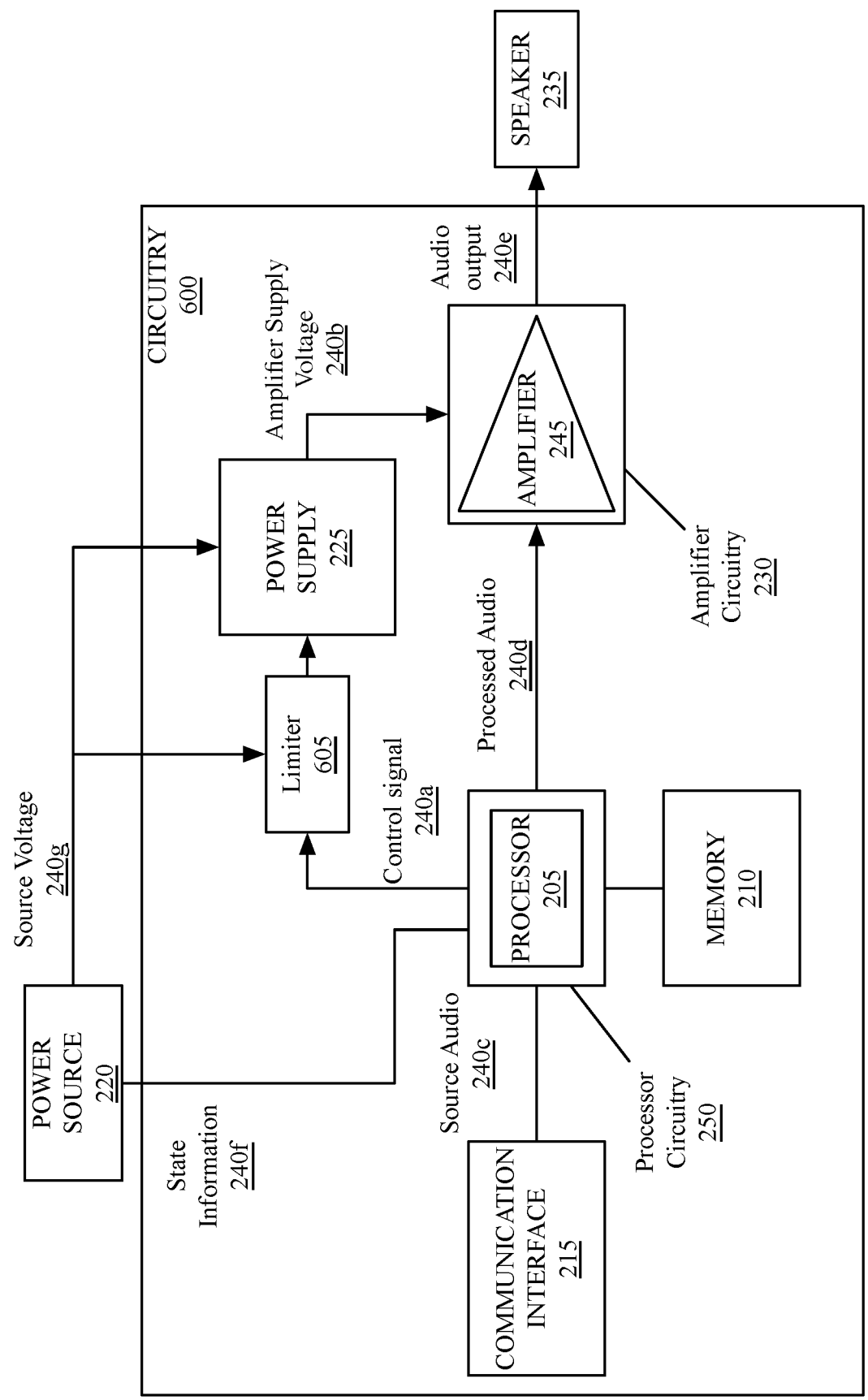
FIG. 6 illustrates a logical diagram of circuitry 600 that is a variation of the circuitry 200 illustrated in FIG. 2, in accordance with an example.

FIG. 6 illustrates a logical diagram of circuitry 600 that is a variation of the circuitry 200 illustrated in FIG. 2. The circuitry 600 is configured to mitigate issues that may occur when the source voltage 240g provided by the power source 220 falls below a low voltage threshold, Vt, (e.g., 3 volts). Referring to FIG. 6, the circuitry 600 includes processor circuitry 250 that includes a processor 205, a memory 210 in communication with the processor circuitry 250, a communication interface 215, a power supply 225, amplifier circuitry 230 that includes an amplifier 245, and a limiter 605. The processor circuitry 250, memory 210, communication interface 215, power supply 225, and amplifier circuitry 230 generally correspond to the components described above having the corresponding reference numbers. A description of these components is not repeated for the sake of brevity.

Relative to the circuitry 200 of FIG. 2, the circuitry 600 of FIG. 6 incorporates a limiter 605 coupled between the processor circuitry 250 and the power supply 225. In particular, the processor circuitry 205 communicates the control signal 240a to the limiter 605, and the limiter 605 communicates the control signal 240a to the reference voltage input of the power supply 225 under certain conditions. The limiter 605 is configured to control the power supply 225 to clamp or limit the amplifier supply voltage 240b provided by the power supply 225 to a particular amplifier supply voltage (e.g., 3 volts) when the source voltage 240g provided by the power source 220 falls below the low voltage threshold, Vt. For example, the normal operating range of the amplifier supply voltage 240b may be between about 3 Volts and 6 Volts. When limited, the amplifier supply voltage 240b may be reduced to 3 Volts (e.g., a minimum allowable voltage for the amplifier 245 to operate) or may be reduced to a voltage that is a percentage (e.g., 5%, 10%, etc.) lower than the maximum voltage observed within the normal operation range. Lowering of the amplifier supply voltage 240b can reduce the drive level of the amplifier 245, which in turn can reduce the load on the power source 220. Reducing the load on the power source 220 can help prevent the source voltage 240g provided by the power source 220 from dropping further below the low voltage threshold, Vt. By performing such mitigation, the playback device can avoid a scenario where the source voltage 240g falls below a minimum required for the processor circuitry 250 and/or the communication interface 215 to operate (e.g., thereby causing the playback device to shut down or otherwise malfunction).

An example of the limiter 605 is configured to receive information that is indicative of the value of the source voltage 240g (e.g., the source voltage 240g itself, a signal associated with the source voltage 240g, data that specifies the value of the source voltage 240g, etc.), and to communicate the control signal 240a to the reference voltage input of the power supply 225, when appropriate. For example, when the source voltage 240g is determined to be at or above the low voltage threshold, Vt, the limiter 605 is configured to output the control signal 240a to the reference voltage input of the power supply 225. This, in turn, causes the amplifier supply voltage 240b to track the voltage associated with the control signal 240a.

When the source voltage 240g is determined to be below the low voltage threshold, Vt, the limiter 605 is configured to perform one or more limiting operations. For instance, an example of the limiter 605 is configured to output a low voltage reference signal as the control signal to the input of the power supply 225a, such as a fixed reference voltage, or a scaled-down version of the control signal 240a received from the processor circuitry 250. This controls the power supply 225 to provide a particular amplifier supply voltage, or a scaled-down version of the amplifier supply voltage 240 voltage that is lower than a voltage that the power supply 225 would otherwise provide.

Figure 7A:
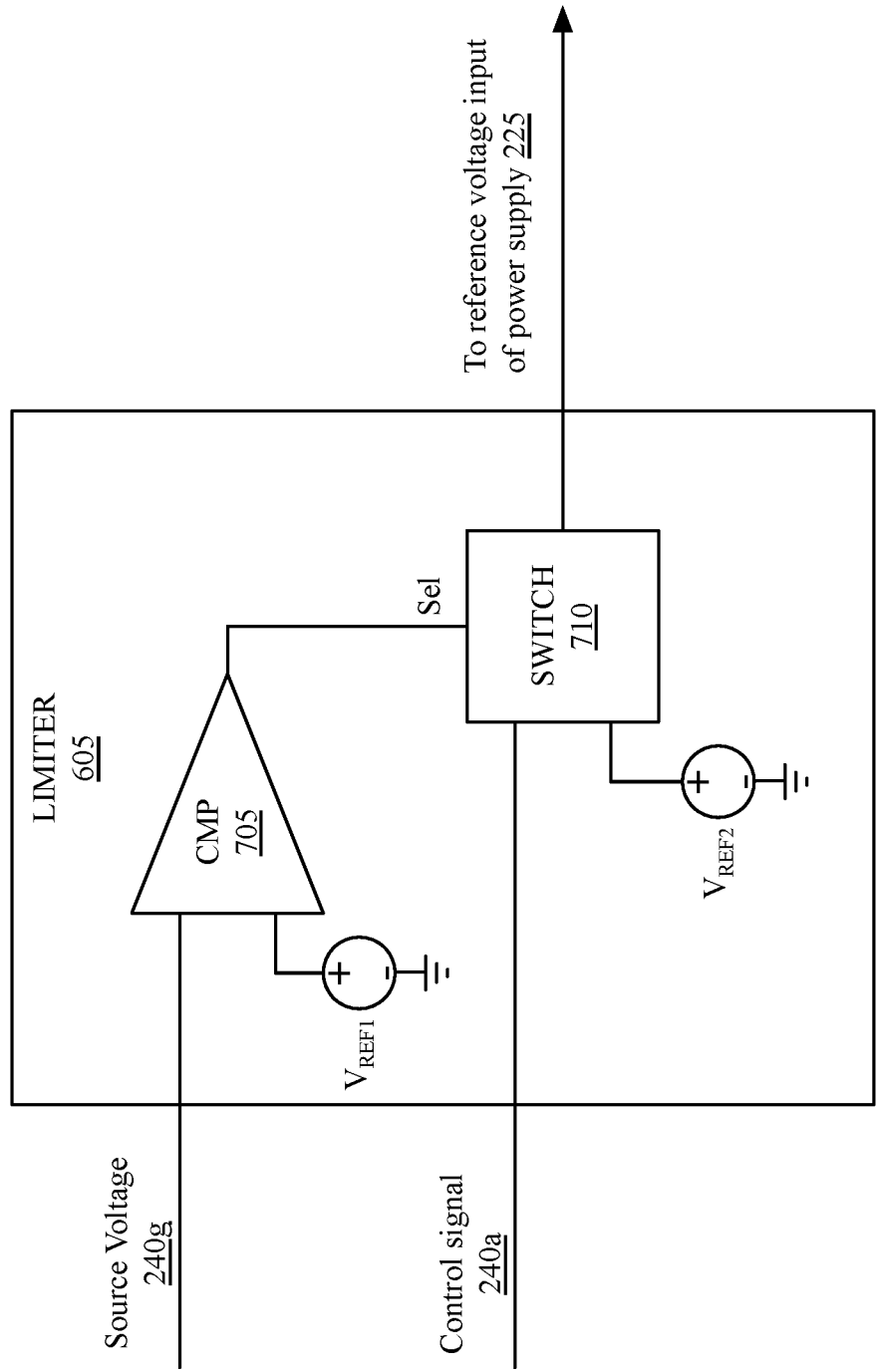
FIG. 7A illustrates a logical diagram of a limiter of the circuitry of FIG. 6, in accordance with an example.
Figure 7B:
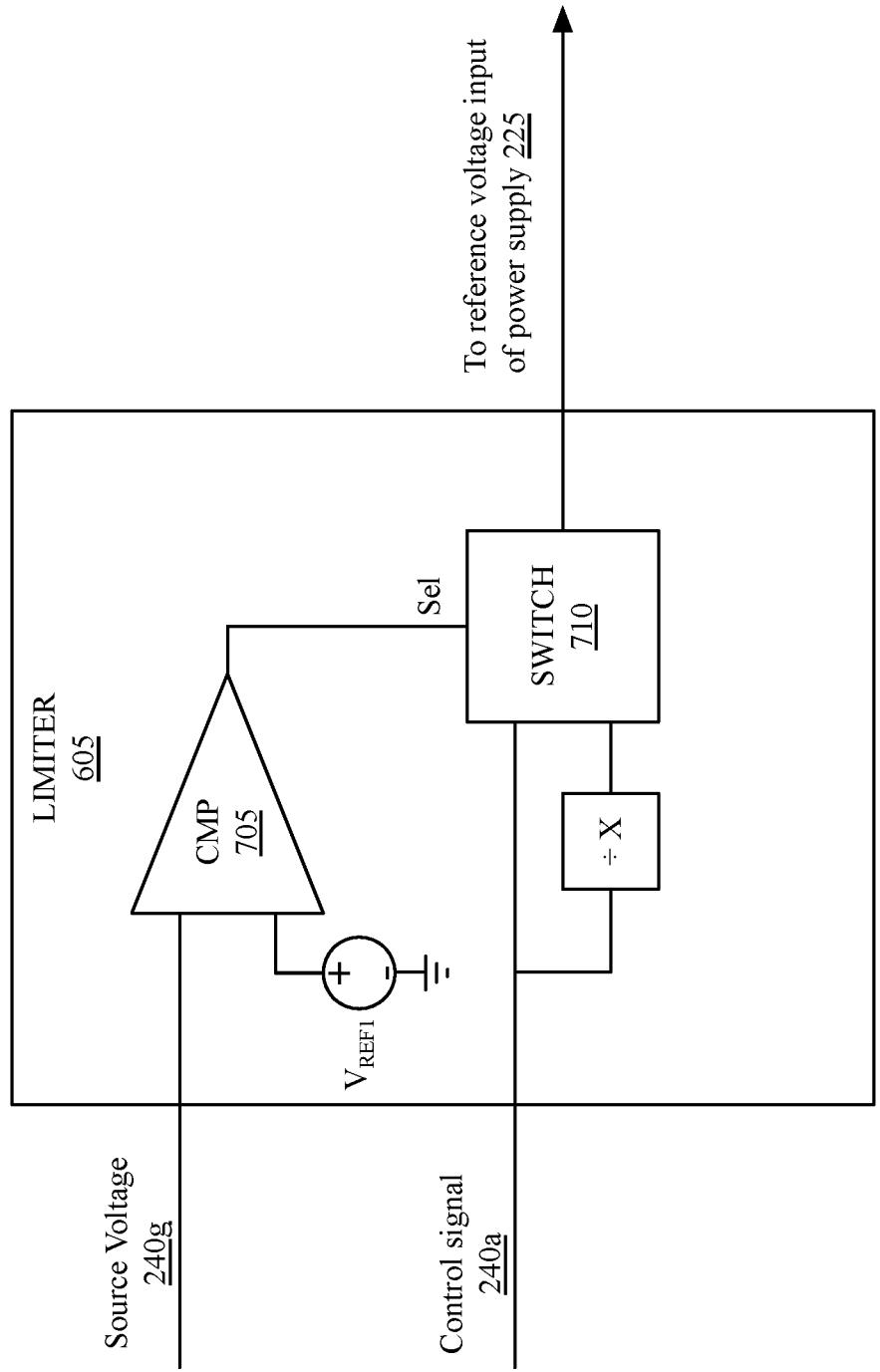
FIG. 7B illustrates a logical diagram of another limiter of the circuitry of FIG. 6, in accordance with an example.

FIGS. 7A and 7B illustrate examples of the limiter 605. The limiter 605 comprises a comparator 705 and a switch 710. The comparator 705 is configured to receive as input the source voltage 240g and a first reference voltage, $V_{REF1}$. An example of the first reference voltage corresponds to the low voltage threshold, Vt, at which the limiter 605 begins limiting operations. In an example, when the source voltage 240g is at or exceeds the first reference voltage, the output of the comparator 705 changes state (e.g., low to high). And when the source voltage 240g falls below the first reference voltage, the output of the comparator 705 changes state (e.g., high to low). An example of the comparator 705 does not incorporate hysteresis so that the state of the output changes when the source voltage 240g exceeds the first reference voltage or becomes lower than the first reference voltage by an imperceptibly small margin. That is, the comparator 705 rapidly changes state after the source voltage 240g exceeds the first reference voltage or becomes lower than the first reference voltage.

An example of the switch 710 comprises a first input, a second input, an output, and a selector input, denoted SEL. The first input is configured to receive the control signal 240a. In the limiter of FIG. 7A, the second input is configured to receive a second reference voltage, $V_{REF2}$. In the limiter of FIG. 7B, the second input is configured to receive a scaled version of the control signal 240a (e.g., the control signal 240a divided by 2).

In operation, the selector input controls the switch 710 to communicate the signal present at one of the first input and the second input to the output based on the state of the selector input (e.g., high or low value). The output of the switch 710 is communicated to the reference voltage input of the power supply 225.

When the source voltage 240g provided by the power source 220 is at or above the low voltage threshold, Vt, the output of the comparator 705 changes to a state that controls the switch 710 to communicate the signal at the first input (e.g., the control signal 240a) to the output of the switch 710 and to the reference voltage input of the power supply 225.

When the source voltage 240g provided by the power source 220 falls below the low voltage threshold, Vt, the output of the comparator 705 changes state (e.g., high to low). This, in turn, controls the switch 710 to communicate the signal at the second input to the output of the switch 710 and to the reference voltage input of the power supply 225. In the limiter of FIG. 7A, the voltage $V_{REF2}$ is communicated to the output of the switch 710 and to the reference voltage input of the power supply 225. In the limiter of FIG. 7B, the scaled version of the control signal 240a is communicated to the output of the switch 710 and to the reference voltage input of the power supply 225.

FIG. 7C illustrates another example of the limiter 605. The limiter 605 comprises a microcontroller 715 and one or more logic gates 720. The microcontroller 715 may execute program instructions to compare the source voltage 240g with one or more thresholds (e.g., a first reference voltage) and output an override signal, denoted OVR, to the one or more logic gates 720. The override signal may be indicative of whether the limiter 605 should output the control signal 240a substantially (or identically) as received to the reference voltage input of the power supply 225 or modify certain portions (or all) of the control signal 240a such that the amplifier supply voltage does not exceed a particular voltage (e.g., a maximum voltage before causing the playback device to shut down or otherwise malfunction from the source voltage 240g getting too low). The one or more logic gates 720 may receive the override signal from the microcontroller 715 and the control signal 240a. The one or more logic gates may be configured to output the control signal 240a or modify the control signal 240a so as not to exceed a particular value based on the override signal.

It should be understood that the one or more logic gate(s) 720 may be implemented in any of a variety of ways depending on the particular implementation. Examples of suitable logic gates that may be employed include OR, NOR, XOR, XNOR, AND, and NAND logic gates. Such logic gates may be implemented in hardware (e.g., hardware logic gates) or implemented in software (e.g., executed by the microcontroller 715). In some implementations, the one or more logic gate(s) 720 may be configured as an OR gate. In these implementations, the OR gate may comprise a first input terminal configured to receive the control signal 240a, a second input terminal configured to receive the OVR signal from the microcontroller 715, and an output terminal configured to output a signal for the reference voltage input of the power supply 225.

FIG. 8A illustrates an example of the source voltage 240g provided by the power source 220 where the source voltage 240g momentarily drops below the low voltage threshold, Vt, due to a sudden increase in the load on the power source 220. FIG. 8B illustrates an example of the amplifier supply voltage 240b and the envelope associated with the audio output 240e during the sudden increase. In the illustrated example, the sudden increase in the load is attributed to a sudden increase in the envelope associated with the audio output 240e, which causes a corresponding increase in drive current to the speaker 235. However, the increase in load can be attributed to other reasons, such as the processor 205 performing a computationally intensive task, the communication interface 215 transmitting information, etc. Further, the illustrated source voltage 240g provided by the power source 220 varies based on the load on the power source 220. In general, this variation is caused by a voltage drop across the output impedance of the power source 220 that is attributed to current flow through the load of the power source 220 (e.g., the amplifier, the processor 205, the communication interface 215, etc.)

During a first time period, $T_1$, the source voltage 240g is above the low voltage threshold, Vt. During this period, the source voltage 240g provided by the power source 220 is above the low voltage threshold, Vt. The output of the comparator 705 of the limiter 605 changes to a state that controls the switch 710 to communicate the signal at the first input (e.g., the control signal 240a) to the output of the switch 710 and to the reference voltage input of the power supply 225. Similarly, the microcontroller 715 changes a state of the override signal to the one or more logic gates 720 such that the one or more logic gates 720 cause the control signal 240a to be output without substantial alteration (e.g., identically). Therefore, the amplifier supply voltage 240b tracks the envelope of the audio output 240e, as described above.

During a second period, $T_2$, the envelope of the audio output 240e increases, and the amplifier supply voltage 240b provided by the power supply 225 tracks the increase. The increase in the envelope of the audio output 240e results in a corresponding increase in the output of the amplifier 245 and, therefore, the drive current of the amplifier 245. As a result, the source voltage 240g begins to drop and eventually drops below the low voltage threshold, Vt.

During a third period, $T_3$, the source voltage 240g provided by the power source 220 falls below the low voltage threshold, Vt, and the output of the comparator 705 changes state (e.g., high to low). This, in turn, controls the switch 710 to communicate the signal at the second input to the output of the switch 710 and to the reference voltage input of the power supply 225. In the case where the voltage $V_{REF2}$ is communicated to the output of the switch 710, a corresponding voltage is communicated to the reference voltage input of the power supply 225, which controls the power supply 225 to lower the amplifier supply voltage 240b. Similarly, the microcontroller 715 changes a state of the override signal to the one or more logic gates 720 such that the one or more logic gates 720 cause the control signal 240a to modified so as not to exceed a maximum value (thereby lowering the amplifier supply voltage 240b in this instance). Lowering the amplifier supply voltage 240b, in turn, lowers the drive current of the amplifier 245. This, in turn, reduces the load on the power source 220 and causes the amplifier supply voltage 240b provided by the power source 220 to increase above the low voltage threshold, Vt.

In some examples, during the third period, $T_3$, the amplitude of the audio output 240e is gradually reduced to further reduce the load on the power source 220. For instance, in an example, the processor circuitry 250 receives an indication that limiting operations have been triggered. This indicates to the processor circuity 250 that the voltage provided by the power source 220 has dropped to a critical value (e.g., below the low voltage threshold, Vt). In response to receiving this indication, the processor circuity 250 reduces the amplitude of the audio output 240e (e.g., by 50%). In some examples, the amplitude is gradually reduced over time (e.g., over a period of 10 seconds). In some examples, a tone or some other indication is communicated to the user to make the user aware that the amplifier output is being reduced or limited, and, therefore, that the power source 220 (e.g., battery) requires charging. In some examples, the processor circuity 250 is configured to maintain the reduction in amplitude until after the source voltage 240g provided by the power source 220 exceeds an upper threshold, such as 20% higher than the low voltage threshold, Vt, to provide a form of hysteresis to prevent the amplitude of the audio output 240e from oscillating between limited and non-limited states.

Additionally, or alternatively, in some examples, the processor circuitry 250 is configured to maintain the reduction in amplitude until after the source voltage 240g provided by the power source 220 voltage exceeds the low voltage threshold, Vt, for a predetermined amount of time (e.g., 10 seconds). In some examples, the processor circuity 250 is configured to maintain the reduction in amplitude until the power source 220 has been recharged.

Figure 9:
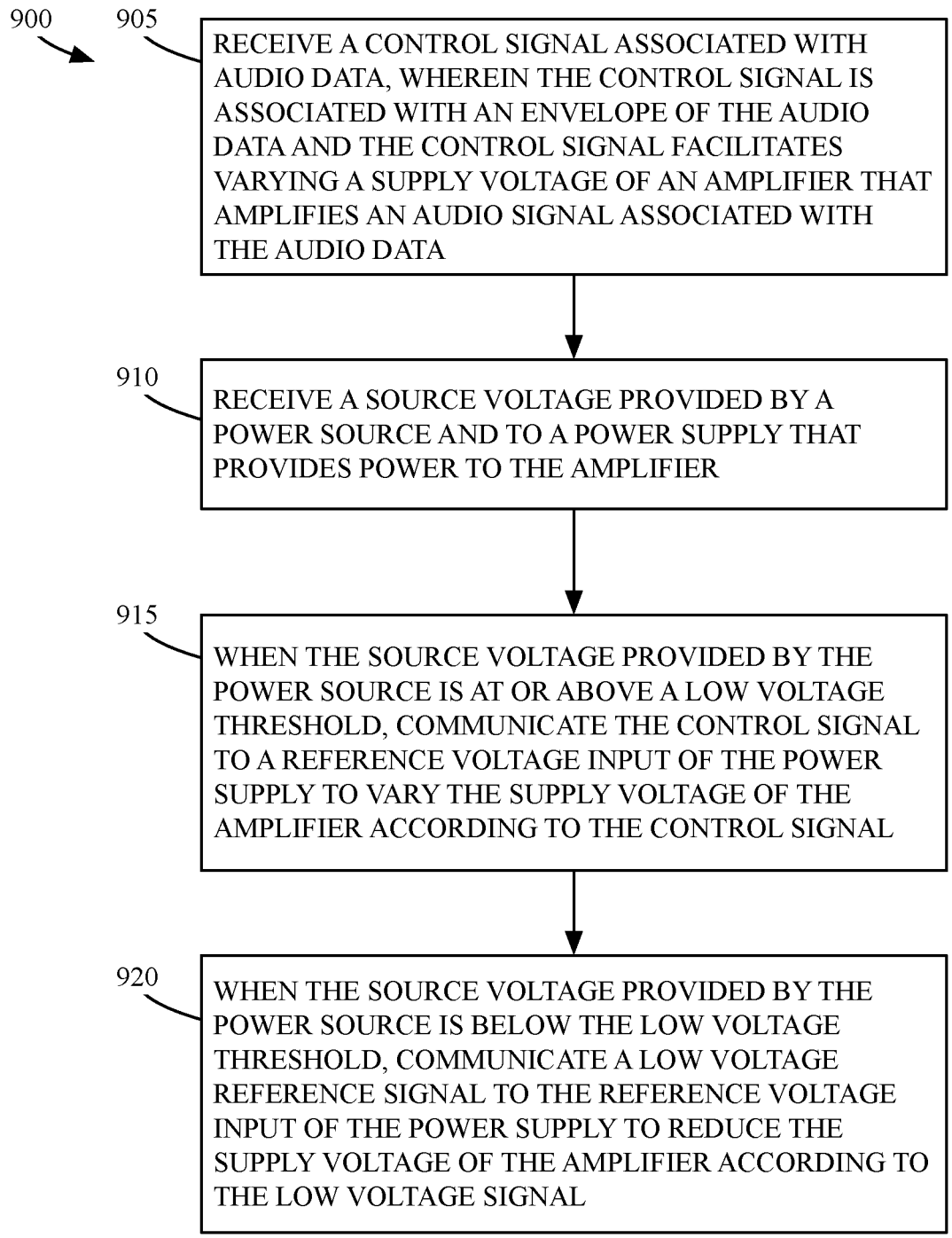
FIG. 9 illustrates operations that may be performed by playback devices and/or circuitry described herein, in accordance with an example.

FIG. 9 illustrates examples of operations 900 performed by, for example, any playback device 110 described herein and/or any circuitry for integration into a playback device described herein, such as the circuitry 200 shown in FIG. 2 or the circuitry 600 shown in FIG. 6. These operations facilitate mitigating issues that may occur when a source voltage 240g provided by a power source 220 falls below a low voltage threshold, Vt. Examples of the operations are implemented via instruction code of the playback devices 110 and/or circuitry (200 and 600) executed by their respective processors 205.

At block 905, a control signal 240a associated with audio data is received. An example of the audio data corresponds to the processed audio 240d described above. As described above, the control signal 240a is associated with an envelope of the audio data and the control signal 240a facilitates varying an amplifier supply voltage 240b provided by a power supply 225 to an amplifier 245 that amplifies an audio signal associated with the audio data.

At block 910, a source voltage 240g provided by a power source 220, and to a power supply 225 that provides power to the amplifier, is received. For example, the limiter 605 described above receives information that specifies a value indicative of the voltage of the source voltage 240g (e.g., the source voltage 240g itself, a signal associated with the source voltage 240g, data that specifies the value of the source voltage 240g, etc.)

At block 915, when the source voltage 240g provided by the power source 220 is at or above a low voltage threshold, Vt, the control signal 240a is communicated to a reference voltage input of the power supply 225 to vary the amplifier supply voltage 240b provided to the amplifier 245 according to the control signal 240a. For example, the control signal 240a, via the reference voltage input, controls the power supply 225 to output an amplifier supply voltage 240b that is a margin higher than the minimum amount of voltage necessary for the amplifier 245 to amplify an audio signal associated with the audio data without appreciable distortion.

At block 920, when the source voltage 240g provided by the power source 220 is below the low voltage threshold, Vt, a low voltage reference signal is communicated to the reference voltage input of the power supply 225 to reduce the amplifier supply voltage 240b provided by the power supply 225 to the amplifier 245 according to the low voltage reference signal. For example, the limiter 605 is configured to output, to the reference voltage input of the power supply 225a, a fixed voltage, or a scaled-down version of the control signal 240a received from the processor circuitry 250. This controls the power supply 225 to provide a minimum amplifier supply voltage, or a scaled-down version of the amplifier supply voltage 240 voltage that is lower than a voltage that the power supply 225 would otherwise provide.

Figure 10:
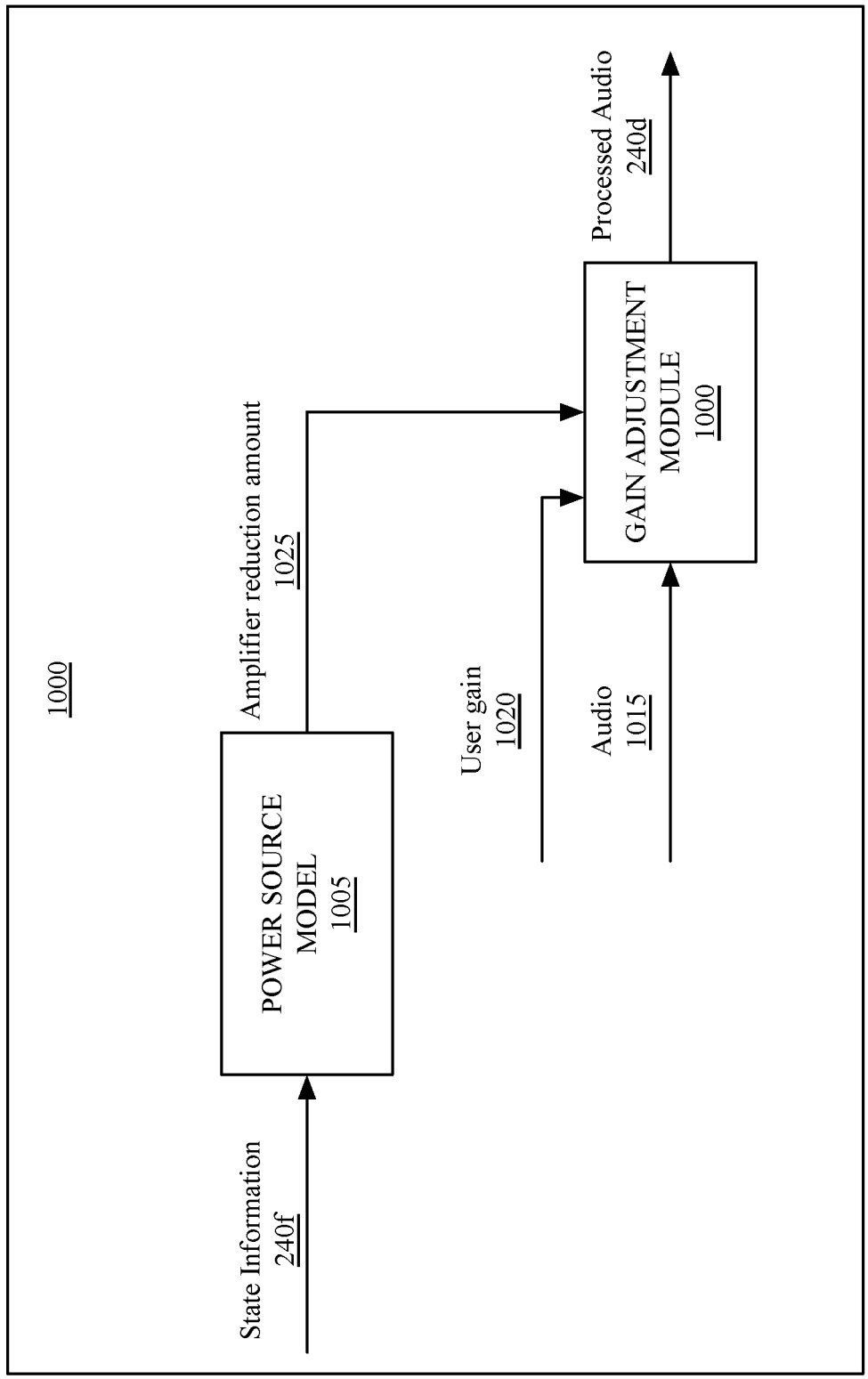
FIG. 10 illustrates a logical diagram of entities that cooperate to minimize the likelihood of the performance of amplifier supply voltage limiting operations, in accordance with an example.

FIG. 10 illustrates an example of a logical diagram 1000 of entities that cooperate to minimize the likelihood that the limiting operations described above will occur. For example, the entities cooperate to facilitate minimizing the likelihood that the source voltage 240g provided by the power source 220 will drop below the low voltage threshold, Vt. The entities include a gain adjustment module 1000 and a power source model 1005. Examples of the gain adjustment module 1000 and the power source model 1005 are implemented by instruction code executed by the processor circuity 250 and/or by other circuits of the circuitry 600. It should be understood that these aspects can be applied to the circuitry 200 of FIG. 2 as well.

An example of the gain adjustment module 1000 is configured to receive as input audio 1015, and to output an amplified version of the audio 1015 as processed audio 240d, which is then communicated to the amplifier 245. An example of the audio 1015 can be pre-processed in that equalization operations, delay operations, and/or other operations may have been performed on the audio 1015 prior to gain adjustment. Although, the gain operation performed by the gain adjustment module 1000 can be applied before or in between these other processing operations.

An example of the gain adjustment module 1000 receives as input a user gain 1020 and an amplifier reduction amount 1025. An example of the user gain 1020 specifies the amount of gain to apply to the audio 1015, which may be related to the gain specified by a user via a controller. The amplifier reduction amount 1025 specifies a gain reduction to apply to the audio 1015. The gain provided by the gain adjustment module 1000 is a function of the user gain 1020 and the amplifier reduction amount 1025. For instance, in an example, if the user gain 1020 is two and the amplifier reduction amount 1025 is one-half, the gain adjustment module 1000 provides a gain of one.

In some examples, the amplifier reduction amount 1025 is not applied uniformly for all audio 1015. For example, the gain associated with low amplitude audio (e.g., below a given decibel level) may be reduced to a lesser extent (or not at all) than the gain associated with high amplitude audio (e.g., higher than a certain decibel level). In another example, the gain associated with high-frequency audio (e.g., above a certain frequency) may be reduced to a lesser extent (or not all) than the gain associated with low-frequency audio (e.g., below a certain frequency).

An example of the power source model 1000 facilitates determining the amplifier reduction amount 1025 to apply to the gain adjustment module 1000 to reduce the load on the power source 220 to minimize the likelihood that the limiting operations by the limiter 605 will occur. For example, the power source model 1000 models the power source 220 in terms of attributes such as the energy capacity, output impedance, capacitance, power source type, etc. The power source model 1000 takes as input the current state of the power source 220 (e.g., the output voltage, the output current, the temperature, etc.) and outputs an amplifier reduction value 1010 that can be applied to the audio 1015 to reduce the gain of the audio 1015 to an amount that minimizes the likelihood that the limiting operations by the limiter 605 will occur.

In operation, an example of the power source model 1000 specifies a gain reduction amount 1025 of zero when the source voltage 240g provided the power source 220 is above the low voltage threshold, Vt, by a predetermined amount such as 20% above the low voltage threshold, Vt. In this state, no gain reduction is applied.

Following this example, when the source voltage 240g provided the power source 220 falls within 20% of the low voltage threshold, Vt, the power source model 1005 outputs a gain reduction amount 1025 greater than zero to lower the gain provided by the gain adjustment module 1000. For example, when the state information 240f indicates that the load current on the power source is beyond a particular current, the temperature of the battery is below a particular temperature, the age of the battery is beyond a particular age, etc., the power source model 1000 outputs a gain reduction amount 1025 that lowers the gain applied by the gain adjustment module 1000.

An example of the power source model 1005 includes a table that relates different currents, temperatures, ages, etc., of the power source 220 with different gain reduction amounts 1025. In this case, the gain reduction applied increases with increased current, decreased temperature, increased age, etc.

In some examples, the power source model 1005 is updated from time-to-time. For example, suppose that gain reduction is being applied for a given state of the battery but the source voltage 240g provided the power source 220 nevertheless falls below the low voltage threshold, Vt, thus triggering the limiting operations described above. In this case, in an example, the power source model 1005 is updated to associate a greater gain reduction with the parameters representing the current state of the power source. For example, instruction code executed by the processor can increase the gain reduction amount by 10%.

Figure 11:
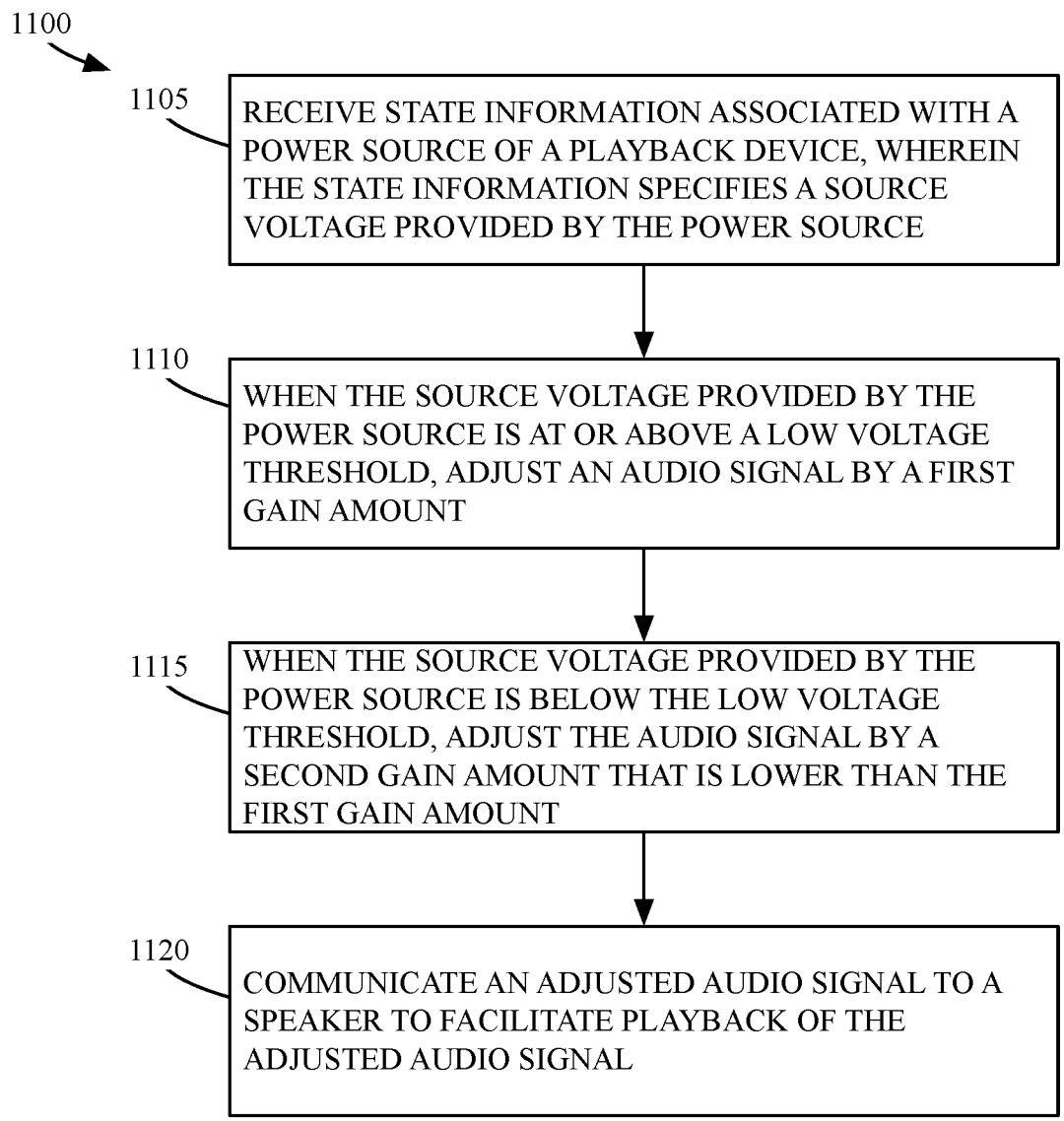
FIG. 11 illustrates operations that may be performed by playback devices and/or circuitry described herein, in accordance with an example.

FIG. 11 illustrates examples of operations 1100 performed by, for example, any playback device 110 described herein and/or any circuitry for integration into a playback device described herein, such as the circuitry 200 shown in FIG. 2 or the circuitry 600 shown in FIG. 6. Examples of the operations are implemented via instruction code of the playback devices 110 and/or circuitry (200 and 600) executed by their respective processors 205.

At block 1105, state information 240f associated with a power source 220 of a playback device 110 is received. The state information 240f specifies a source voltage 240g provided by the power source 220. Examples of the state information 240f also include one or more of the temperature, age, impedance, etc., associated with a battery or other components of the power source 220.

At block 1110, when the source voltage 240g provided by the power source 220 is at or above a low voltage threshold, Vt, an audio signal 1015 is adjusted by a first gain amount. For example, the first gain amount corresponds to the amount of gain specified by a user via a controller. An example of the first gain amount is applied when the source voltage 240g provided the power source 220 is above the low voltage threshold, Vt, by a predetermined amount such as 20% above the low voltage threshold, Vt.

At block 1114, when the source voltage 240g provided by the power source 220 is below the low voltage threshold, the audio signal 1015 is adjusted by a second gain amount that is lower than the first gain amount. Following the example above, when the source voltage 240g provided the power source 220 falls within 20% of the low voltage threshold, Vt, the audio signal 1015 is adjusted by a second gain amount such as 75% of the first gain amount. In an example, the second gain amount depends on information specified in the state information 240f, such as the load current associated with the power source 220, the temperature of the power source 220, the age of the power source 220, the type or model number of the power source 220, etc.

In some examples, the second gain amount varies linearly with the difference between the source voltage 240g provided the power source 220 and the low voltage threshold, Vt. For example, the second gain corresponds to the first gain amount when the source voltage 240g provided the power source 220 equals the low voltage threshold, Vt, and falls at a linear rate thereafter as the source voltage 240g provided the power source 220 deviates below the low voltage threshold, Vt. In some examples, the second gain amount varies non-linearly with the difference between the source voltage 240g provided the power source 220 and the low voltage threshold, Vt. In some examples, the second gain amount varies in a step-wise manner (e.g., through multiple discrete steps) with the difference between the source voltage 240g provided the power source 220 and the low voltage threshold, Vt.

At block 1120, the adjusted audio signal is communicated to a speaker 235 to facilitate playback of the adjusted audio signal.

IV. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for the implementation of the functions and methods.

It should be appreciated that references to transmitting information to particular components, devices, and/or systems herein should be understood to include transmitting information (e.g., signals, messages, requests, responses)

indirectly or directly to the particular components, devices, and/or systems. Thus, the information being transmitted to the particular components, devices, and/or systems may pass through any number of intermediary components, devices, and/or systems prior to reaching its destination. For example, a processor may transmit information to an SMPS by first transmitting the information to an intermediary component that, in turn, transmits the information to the SMPS. Further, modifications may be made to the information by the intermediary component. For example, an intermediary component may modify a portion of the information, reformat the information, and/or incorporate additional information.

Similarly, references to receiving information from particular components, devices, and/or systems herein should be understood to include receiving information (e.g., signals, messages, requests, responses) indirectly or directly from the particular components, devices, and/or systems. Thus, the information being received from the particular components, devices, and/or systems may pass through any number of intermediary components, devices, and/or systems prior to being received. For example, an amplifier may receive information from a processor indirectly by receiving information from a digital-to-analog converter that originated from the processor. Further, modifications may be made to the information by the intermediary devices. For example, intermediary devices may modify a portion of the information, reformat the information, and/or incorporate additional information.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well-known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

Example Features (Feature 1) A playback device comprising: a communication interface; processor circuitry comprising at least one processor coupled to the communication interface; at least one non-transitory computer-readable medium coupled to the at least one processor; program instructions stored on the at least one non-transitory computer-readable medium that are executable by the at least one processor such that the processor circuitry is configured to: after receipt of first audio data representing audio content via the communication interface, generate and output second audio data based on the first audio data; and at least in part while generating and outputting the second audio data, generate and output a control signal associated with the second audio data to vary a supply voltage for a Class-D amplifier; a switch-mode power supply (SMPS) coupled to the processor circuitry, wherein the SMPS is configured to receive the control signal from the processor circuitry and to vary the supply voltage for the Class-D amplifier based on the control signal; and amplifier circuitry coupled to the processor circuitry and the SMPS, wherein the amplifier circuitry comprises the Class-D amplifier powered by the supply voltage from the SMPS, and wherein the amplifier circuitry is configured to receive the second audio data from the processor circuitry and generate, using the Class-D amplifier, an analog audio signal to drive a speaker based on the second audio data.

(Feature 2) The playback device of feature 1, wherein the second audio data comprises a digital audio signal, wherein the playback device further comprises a digital-to-analog converter (DAC) coupled between the processor circuitry and the Class-D amplifier.

(Feature 3) The playback device of feature 2, wherein the amplifier circuitry comprises the DAC and wherein the amplifier circuitry is integrated into a single integrated circuit (IC) die.

(Feature 4) The playback device of feature 1, wherein the supply voltage tracks an amplifier audio output voltage associated with the analog audio signal and has a value of between 0.1% and 35% greater than the amplifier audio output voltage.

(Feature 5) The playback device of feature 1, wherein a maximum frequency of the supply voltage is between 0.1 Hz and about 20 kHz.

(Feature 6) The playback device of feature 1, further comprising a power source coupled to the SMPS and wherein the power source comprises at least one of: an energy harvester, a battery, a wireless power receiver, or a power input port.

(Feature 7) The playback device of feature 6, wherein the processor circuitry is configured to receive information indicative of at least one state of the power source, wherein the program instructions executed by the at least one processor such that the processor circuitry is configured to generate and output the control signal comprises program instructions executed by the at least one processor such that the processor circuitry is configured to generate the control signal based on the at least one state of the power source.

(Feature 8) The playback device of feature 7, wherein the power source comprises the battery and wherein the at least one state of the power source comprises at least one of: a temperature of the battery, a state-of-charge of the battery, an age of the battery, a load on the battery, or an internal impedance of the battery.

(Feature 9) The playback device of feature 1, wherein the SMPS comprises at least one of a boost converter, a buck converter, a buck-boost converter, a flyback converter, or a resonant converter.

(Feature 10) The playback device of feature 1, further comprising program instructions stored on the at least one non-transitory computer-readable medium that are executable by the at least one processor such that the processor circuitry is configured to forecast a value of the supply voltage to the amplifier and wherein the program instructions executed by the at least one processor such that the processor circuitry is configured to generate and output the control signal comprises program instructions executed by the at least one processor such that the processor circuitry is configured to generate the control signal based on the forecasted value of the supply voltage.

(Feature 11) The playback device of feature 1, wherein the playback device is configured to playback the audio content in synchrony with at least one other playback device.

(Feature 12) A method performed by a playback device comprising: receiving, via a communication interface, first audio data representing audio content from a computing system; generating and outputting, using processor circuitry comprising at least one processor, second audio data based on the first audio data; at least in part while generating and outputting the second audio data, generating and outputting, using the processor circuitry, a control signal associated with the second audio data to vary a supply voltage for a Class-D amplifier; receiving, by a switch-mode power supply (SMPS), the control signal from the processor circuitry; varying, using the SMPS, the supply voltage for the Class-D amplifier based on the control signal; receiving, by amplifier circuitry comprising the Class-D amplifier, the second audio data from the processor circuitry; and at least in part while varying the supply voltage for the Class-D amplifier, generating, using the Class-D amplifier, a first analog audio signal to drive a speaker based on the second audio data.

(Feature 13) The method of feature 12, wherein the second audio data comprises a digital signal, wherein generating the analog audio signal comprises: converting, using a digital-to-analog converter (DAC) integrated into the amplifier circuit, the digital signal into an analog signal, and amplifying, using the Class-D amplifier, the analog signal.

(Feature 14) The method of feature 12, wherein varying the supply voltage comprises varying the supply voltage to track an amplifier audio output voltage associated with the analog audio signal such that the supply voltage has a value of between 0.1% and 35% greater than the amplifier audio output voltage.

(Feature 15) The method of feature 12, wherein generating and outputting the control signal comprises generating a control signal such that the supply voltage has a maximum frequency between 0.1 Hz and about 20 kHz.

(Feature 16) The method of feature 12, further comprising: receiving, by the SMPS, power from a power source that comprises at least one of: an energy harvester, a battery, a wireless power receiver, or a power input port.

(Feature 17) The method of feature 12, further comprising receiving, by the processor circuitry, information indicative of at least one state of a power source and wherein generating and outputting the control signal comprises generating the control signal based on the at least one state of the power source.

(Feature 18) Circuitry for a playback device, the circuitry comprising: at least one circuit board; a communication interface attached to the at least one circuit board; processor circuitry attached to the at least one circuit board and comprising at least one processor; at least one non-transitory computer-readable medium attached to the at least one circuit board; program instructions stored on the at least one non-transitory computer-readable medium that are executable by the at least one processor such that the processor circuitry is configured to: after receipt of first audio data representing audio content via the communication interface, generate and output second audio data based on the first audio data; and at least in part while generating and outputting the second audio data, generate and output a control signal associated with the second audio data to vary a supply voltage for an audio amplifier; a power supply attached to the at least one circuit board and coupled to the processor circuitry, wherein the power supply is configured to receive the control signal from the processor circuitry and to vary the supply voltage for the audio amplifier based on the control signal; and an amplifier circuitry attached to the at least one circuit board and coupled to the processor circuitry and the power supply, wherein the amplifier circuitry comprises the audio amplifier powered by the supply voltage from the power supply, and wherein the amplifier circuitry is configured to receive the second audio data from the processor circuitry and generate, using the audio amplifier, an analog audio signal to drive a speaker based on the second audio data.

(Feature 19) The circuitry of feature 18, wherein the audio amplifier comprises a switching amplifier.

(Feature 20) The circuitry of feature 18, wherein the power supply comprises a switch-mode power supply (SMPS).

(Feature 21) The circuitry of feature 18, wherein the processor circuitry comprises a system-on-a-chip.

(Feature 22) The circuitry of feature 21, wherein the at least one non-transitory computer readable medium comprises a memory integrated into the system-on-a-chip.

The invention claimed is:

1. A playback device comprising:
a wireless communication interface;
processor circuitry comprising at least one processor coupled to the wireless communication interface;
at least one non-transitory computer-readable medium coupled to the at least one processor having stored thereon program instructions that are executable by the at least one processor such that the processor circuitry is configured to:
after receipt of first audio data representing audio content via the wireless communication interface, generate second audio data based on the first audio data, the second audio data including a digital audio signal; and at least in part during the generation of the second audio data, generate a control signal associated with the second audio data to vary a supply voltage for an audio amplifier, the control signal indicating a target supply voltage for the audio amplifier;

a switch-mode power supply (SMPS) coupled to the processor circuitry, wherein the control signal from the processor circuitry is communicated to the SMPS to vary the supply voltage for the audio amplifier based on the control signal;

a power source coupled to the SMPS and wherein the power source comprises at least one of: an energy harvester, a battery, a wireless power receiver, or a power input port; and amplifier circuitry coupled to the processor circuitry and the SMPS, wherein the amplifier circuitry comprises the audio amplifier powered by the supply voltage from the SMPS, and wherein the amplifier circuitry is configured to receive the second audio data from the processor circuitry and to generate, using the audio amplifier, an analog audio signal to drive a speaker based on the second audio data;

wherein the processor circuitry is configured to receive state information indicative of at least one state of the power source; and wherein the program instructions executable by the at least one processor such that the processor circuitry is configured to generate the control signal comprise program instructions executable by the at least one processor such that the processor circuitry is configured to generate the control signal based on the at least one state of the power source.

2. The playback device of claim 1, wherein the playback device further comprises a digital-to-analog converter (DAC) coupled between the processor circuitry and the audio amplifier.

3. The playback device of claim 2, wherein the amplifier circuitry comprises the DAC and wherein the amplifier circuitry is integrated into a single integrated circuit (IC) die.

4. The playback device of claim 1, wherein the supply voltage tracks an amplifier audio output voltage associated with the analog audio signal, and wherein the supply voltage has a value of between 0.1% and 35% greater than the amplifier audio output voltage.

5. The playback device of claim 1, wherein a maximum frequency of the supply voltage is between 0.1 Hz and 20 kHz.

6. The playback device of claim 1, wherein the power source comprises the battery, and wherein the at least one state of the power source comprises at least one of: a temperature of the battery, a state-of-charge of the battery, an age of the battery, a load on the battery, or an internal impedance of the battery.

7. The playback device of claim 1, further comprising:
a limiter circuit coupled to the power source and configured to limit the supply voltage for the audio amplifier to a maximum voltage when a source voltage of the power source falls below a low voltage threshold.

8. The playback device of claim 7, wherein the limiter circuit is coupled between the processor circuitry and the SMPS and wherein the limiter circuit is configured to:
receive the control signal from the processor circuitry;
communicate the control signal to the SMPS when the source voltage is above the low voltage threshold; and
modify the control signal communicated to the SMPS such that the supply voltage does not exceed the maximum voltage when the power source voltage is below the low voltage threshold.

9. The playback device of claim 1, wherein the SMPS comprises at least one of: a boost converter, a buck converter, a buck-boost converter, a flyback converter, or a resonant converter.

10. The playback device of claim 1, further comprising program instructions stored on the at least one non-transitory computer-readable medium that are executable by the at least one processor such that the processor circuitry is configured to forecast a value of the supply voltage to the audio amplifier and wherein the program instructions executable by the at least one processor such that the processor circuitry is configured to generate the control signal comprise program instructions executable by the at least one processor such that the processor circuitry is configured to generate the control signal based on the forecasted value of the supply voltage.

11. The playback device of claim 1, wherein the playback device is configured to playback the audio content in synchrony with at least one other playback device.

12. The playback device of claim 1, wherein the audio amplifier comprises a Class-D amplifier.

13. A method performed by a playback device comprising:
receiving, via a wireless communication interface, first audio data representing audio content from a computing system;
generating, using processor circuitry comprising at least one processor, second audio data based on the first audio data, the second audio data comprising a digital signal;
receiving, by the processor circuitry, state information indicative of at least one state of a power source;
at least in part while generating the second audio data, generating, using the processor circuitry, a control signal based on the at least one state of the power source and associated with the second audio data to vary a supply voltage for an audio amplifier, the control signal indicating a target supply voltage for the audio amplifier;
varying, using a switch-mode power supply (SMPS), the supply voltage for the audio amplifier based on the control signal;
receiving, by amplifier circuitry comprising the audio amplifier, the second audio data from the processor circuitry; and
at least in part while varying the supply voltage for the audio amplifier, generating, using the audio amplifier, an analog audio signal to drive a speaker based on the second audio data.

14. The method of claim 13, wherein generating the analog audio signal comprises:
converting, using a digital-to-analog converter (DAC) integrated into the amplifier circuitry, the digital signal into an analog signal; and
amplifying, using the audio amplifier, the analog signal.

15. The method of claim 13, wherein varying the supply voltage comprises varying the supply voltage to track an amplifier audio output voltage associated with the analog audio signal such that the supply voltage has a value of between 0.1% and 35% greater than the amplifier audio output voltage.

16. The method of claim 13, wherein generating the control signal comprises generating a control signal such that the supply voltage has a maximum frequency between 0.1 Hz and 20 kHz.

17. The method of claim 13, further comprising:
receiving, by the SMPS, power from the power source that comprises at least one of: an energy harvester, a battery, a wireless power receiver, or a power input port.

* * * * *